(12) United States Patent
Kaneko et al.

(10) Patent No.: US 7,217,950 B2
(45) Date of Patent: May 15, 2007

(54) INSULATED GATE TUNNEL-INJECTION DEVICE HAVING HETEROJUNCTION AND METHOD FOR MANUFACTURING THE SAME

(75) Inventors: Saichirou Kaneko, Yokosuka (JP); Masakatsu Hoshi, Yokohama (JP); Kraisorn Throngnumchai, Yokohama (JP); Tetsuya Hayashi, Yokosuka (JP); Hideaki Tanaka, Yokosuka (JP); Teruyoshi Mihara, Yokosuka (JP)

(73) Assignee: Nissan Motor Co., Ltd., Kanagawa-ken (JP)

(*) Notice: Subject to any disclaimer, the term of this patent is extended or adjusted under 35 U.S.C. 154(b) by 0 days.

(21) Appl. No.: 10/682,154

(22) Filed: Oct. 10, 2003

(65) Prior Publication Data

US 2004/0079989 A1 Apr. 29, 2004

(30) Foreign Application Priority Data

| Oct. 11, 2002 | (JP) | ............................ P2002-298944 |
| Oct. 16, 2002 | (JP) | ............................ P2002-301540 |
| Oct. 18, 2002 | (JP) | ............................ P2002-305066 |
| Nov. 7, 2002 | (JP) | ............................ P2002-324308 |

(51) Int. Cl.
  *H01L 29/78* (2006.01)
(52) U.S. Cl. ...................................... 257/20; 257/192
(58) Field of Classification Search ................ 257/76, 257/77, 136, 192, 264, 328, 330, 20
  See application file for complete search history.

(56) References Cited

U.S. PATENT DOCUMENTS 5,378,912 A * 1/1995 Pein ............................ 257/335
5,753,938 A * 5/1998 Thapar et al. ................. 257/77
5,939,754 A * 8/1999 Hoshi .......................... 257/342
6,002,143 A * 12/1999 Terasawa ...................... 257/77
6,313,487 B1 * 11/2001 Kencke et al. ............... 257/192

FOREIGN PATENT DOCUMENTS

| JP | 10-233503 | 9/1998 |
| JP | 2002-100773 A | 4/2002 |

OTHER PUBLICATIONS

V.V. Afanas'ev, et al. "Observation of Carbon Clusters at the 4H-SiC/SiO$_2$ Interface." Material Science Forum vols. 264-268 (1998) pp. 857-860.

V.V. Afanasev, et al. "Intrinsic SiC/SiO$_2$ Interface States." Phys. State. Sol. (A) 162 (1997) pp. 321-327.

* cited by examiner

*Primary Examiner*—Thomas L. Dickey
(74) *Attorney, Agent, or Firm*—McDermott Will & Emery LLP

(57) ABSTRACT

The present invention-provides a tunnel-injection device which encompasses, a reception layer made of a first semiconductor, a barrier-forming layer made of a second semiconductor having a bandgap-narrower than the first semiconductor, being in metallurgical contact with the reception layer, a gate insulating film disposed on the barrier-forming layer. The gate electrode controls the width of the barrier generated at the heterojunction interface between the reception layer and the barrier-forming layer so as to change the tunneling probability of carriers through the barrier. The device further encompasses a carrier receiving region being contact with the reception layer and a carrier-supplying region being contact with the barrier-forming layer.

19 Claims, 25 Drawing Sheets

INSULATED GATE TUNNEL-INJECTION DEVICE HAVING HETEROJUNCTION AND METHOD FOR MANUFACTURING THE SAME

BACKGROUND OF THE INVENTION

1. Field of the Invention

The present invention relates to a switching device using tunnel injection, which are particularly adapted for wide bandgap semiconductor device and a method for manufacturing the switching device. The invention particularly relates to a heterojunction device using an insulated gate structure.

2. Description of the Related Art

The bandgap of SiC is wide, and it's maximum breakdown field is larger than silicon (Si) one figure. Furthermore, the natural oxide of SiC is silicon oxide ($SiO_2$), and the thermal oxidation film can be formed easily on the surface of SiC by a method the same as that for Si. For this reason, SiC is anticipated for use in a high-speed/high breakdown voltage switching device used in a battery car, and in-particular when it is used as a high power unipolar/bipolar device, it is hoped that SiC will provide a superior material. For example, Japanese Patent Laid-Open-no. 10-233503 discloses earlier SiC power MOSFET. In this earlier SiC power MOSFET, an $n^-$ type SiC epitaxial layer is formed on a heavily doped $n^+$ type SiC substrate. And, in a predetermined region in a top surface of the epitaxial layer, $p^-$ type body regions and $n^+$ type source regions are formed. In addition, through a gate insulation film, a gate electrode is disposed above the $n^-$ type SiC epitaxial layer, and the gate electrode is covered by an inter-layer insulation film. Source electrodes are formed so as to contact with $p^-$ type body regions and $n^+$ type source regions and, a drain electrode is formed on the back surface of the $n^+$ type SiC substrate.

In a bias condition such that the voltage is applied between the drain and source electrodes, when a positive voltage is applied to the gate electrode, a channel region of an inversion type is formed on the top surface of the $p^-$ type body region facing the gate electrode, and current conducts from the drain to source electrodes. By removing the voltage applied to the gate electrode, the drain electrode is electrically isolated from the source electrode, and a switching function is manifested.

SUMMARY OF THE INVENTION

However, there is a problem in the SiC power MOSFET shown in Japanese Patent Laid-Open-no. 10-233503. Namely, imperfect crystallographic structures are generated at the interface between the gate insulation film and the inversion type channel region, or a large number of interface states are generated (See V. V. Afanasev, M. Bassler, G. Pensl and M. Schulz, Phys. Stat. Sol. (A) 162 (1997) p 321). The carbon cluster is known to be one of the causes of the interface states (See V. V. Afanasev, A. Stesmans and C. I. Harris, Materials Science Forum Vols. 264–268 (1998)pp. 857–860). The gate insulation film is usually formed by the thermal oxidation of SiC. In the thermal oxidation of SiC, carbon and silicon are simultaneously oxidized. Although it may depend on oxidation temperature, as the oxidation reaction advances, many of the oxidized carbon atoms take forms of such as CO, $CO_2$, which out-diffuse through the silicon oxide film from the silicon oxide film /SiC interface, and are exhausted to the outside of oxidation reaction system. However, some carbon atoms generate clusters in the silicon oxide film /SiC interface. Such a cluster is an aggregate of the $sp_2$-coupled carbon atoms, and generates the interface state. Since the carbon atoms of the carbon cluster are supplied from the oxidizing reaction of the SiC, the generation of the carbon cluster is not avoided, as far as the gate insulation film is formed by the thermally oxidization of the SiC, and the reduction of the interface states in the interface between the silicon oxide film and the SiC surface is difficult. The interface states act as electron traps.

In light of the above discussion, the carrier mobility in the inversion type channel formed on the top surface of the channel region is very small, and there is a problem in that channel resistance is large. If a channel length can be formed short, the channel resistance becomes small. However, if the channel length is formed too short, as a high voltage is applied to the drain electrode under the condition that the gate and source electrodes are grounded, there is a concern that a punch through occurs in the channel region. Actually, it is difficult to delineate the channel length to be less than 1 μm, and as a result, there is a problem that the on-state resistance of the SiC power MOSFET becomes high. In addition, there are attempts to use a silicon oxide film formed by a deposition method such as the CVD method for the gate insulation film, without using the thermal oxidation method. However, in this case, since the film quality of the CVD silicon oxide film is remarkably inferior to the normal thermal oxidation film, the breakdown voltage of the gate insulation film is reduced. Furthermore, in the MOSFET, for example, in the case that the gate insulation film is made of silicon oxide film, when a high voltage is applied to the drain electrode so that a high electric field can spread to the drain region, because the gate insulation film contacts with the drain region, there have been cases where the gate insulation film suffers from high breakdown field, before the drain region made of the SiC reaches the critical electric field. Because the breakdown voltage of the gate insulation film limits the withstanding voltage of the element, improvement of the maximum operating voltage of the SiC semiconductor device is difficult.

In view of these situations, it is an object of the present invention to provide a SiC semiconductor device having a high breakdown voltage with low on-state resistance and the manufacturing method of the SiC semiconductor device.

Another object of the present invention is to provide a SiC semiconductor device having high breakdown voltage of the gate insulation film and high channel mobility and the manufacturing method of the SiC semiconductor device.

To achieve the above-mentioned objects, a feature of the present invention inheres in a tunnel-injection device encompassing (a) a reception layer made of a first semiconductor; (b) a barrier-forming layer made of a second semiconductor having a bandgap-narrower than the first semiconductor, being in metallurgical contact with the reception layer; (c) a gate insulating film disposed on the barrier-forming layer; (d) a gate electrode disposed on the gate insulating film configured to control the width of the barrier generated at the interface between the reception layer and the barrier-forming layer so as to change the tunneling probability of carriers through the barrier; (e) a carrier receiving region being contact with the reception layer, configured to receive the carriers injected by tunneling through the barrier; and (f) a carrier-supplying region being contact with the barrier-forming layer, configured to supply the carriers to the barrier-forming layer.

Another feature of the present invention inheres in a method for fabricating a tunnel-injection device encompassing (a) preparing a base body made of a first semiconductor;

(b) growing a layer made of a second semiconductor having a bandgap-narrower than the first semiconductor on a surface of the base body; (c) doping first impurity atoms in the layer so as to form a barrier-forming layer; (d) doping selectively second impurity atoms with heavier doping level than the barrier-forming layer so as to form a carrier-supplying region, configured to supply carriers to the barrier-forming layer; (e) depositing a gate insulating film on the barrier-forming layer; and (f) forming a gate electrode on the gate insulating film, the gate electrode is configured to control the width of the barrier generated at the interface between the base body and the barrier-forming layer so as to change the tunneling probability of carriers through the barrier.

Still another feature of the present invention inheres in a tunnel-injection device encompassing (a) means for forming a heterojunction so as to generate a band-edge discontinuity barrier at the interface of the heterojunction; (b) means for supplying carriers so as to accumulate the carriers at the interface of the heterojunction; (c) means for applying electric field to the band-edge discontinuity barrier so as to change the tunneling probability of the carriers through the band-edge discontinuity barrier; and (d) means for receiving carriers injected through the band-edge discontinuity barrier by tunneling.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in-practice.

BRIEF DESCRIPTION OF THE DRAWINGS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in-particular that the layer thicknesses are arbitrarily drawn for facilitating the reading of the drawings.

It is to be understood that the indicator "+" in the Figures indicates relatively heavy doping and the indicator "−" in the Figures indicates relatively light doping.

DETAILED DESCRIPTION OF THE EMBODIMENTS

In the following description specific details are set forth, such as specific materials, process and equipment in order to provide a thorough understanding of the present invention. It will be apparent, however, to one skilled in the art that the present invention may be practiced without these specific details. In other instances, well-known manufacturing materials, process and equipment are not set forth in detail in order not unnecessary obscure the present invention. Prepositions, such as "on", "over", "under", and "beneath" are defined with respect to a planar surface of the substrate, regardless of the orientation in which the substrate is actually held. A layer is on another layer even if there are intervening layers.

Figure 1:
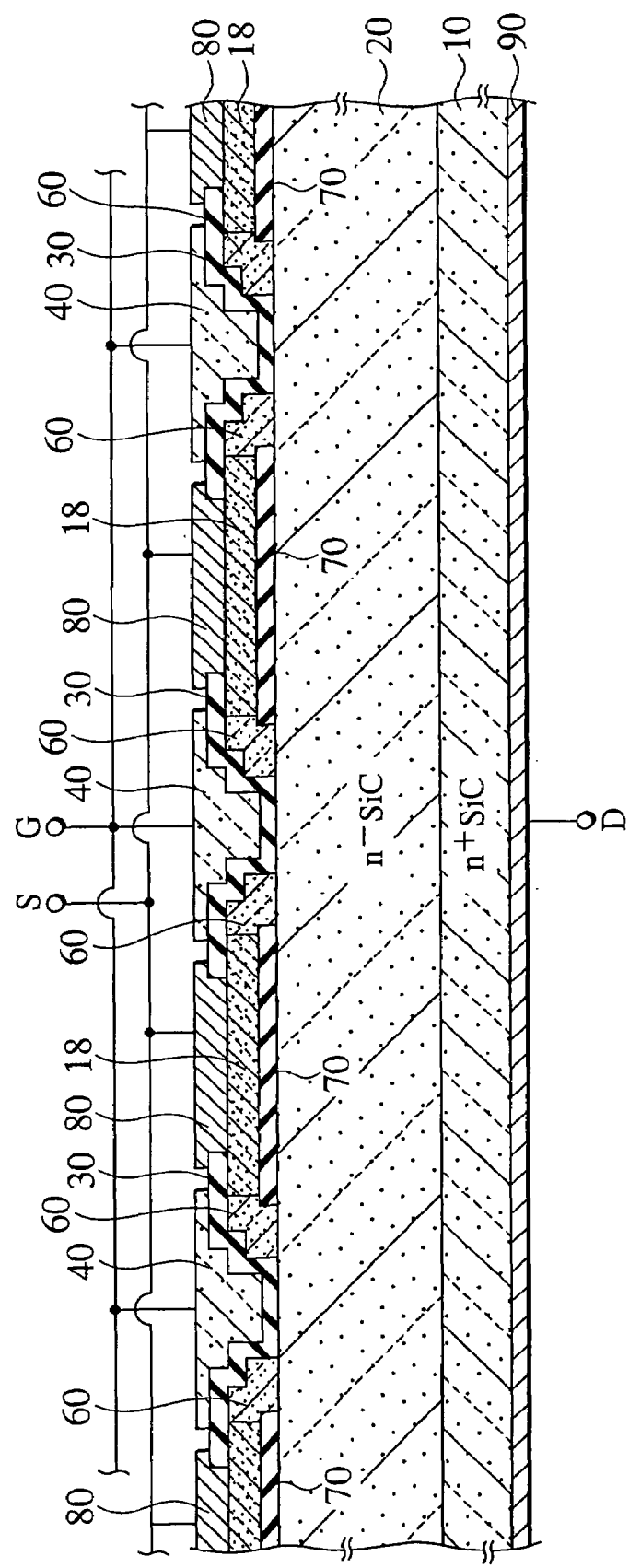
FIG. 1 is a cross sectional view showing a part of a tunnel-injection device of the first embodiment of the present invention.

1. First Embodiment 1.1 Basic Configuration of First Embodiment:

FIG. 1 shows a basic configuration of a tunnel-injection device associated with a first embodiment of the present invention. FIG. 1 shows cross-sectional views of three adjacent unit cells in the multi-channel structure. In the multi-channel structure, a plurality of gate electrodes 40 and a plurality of source electrodes 80 are mutually arranged in parallel so as to implement an interdigital topology. The gate electrodes 40 and source electrodes 80 are respectively delineated in stripe geometries.

As shown in FIG. 1, the basic configuration of the tunnel-injection device associated with the first embodiment of the present invention encompasses a reception layer 20 made of a first semiconductor and a plurality of barrier-forming layers 60 made of a second semiconductor having a bandgap-narrower than the first semiconductor. Each of the barrier-forming layer 60 metallurgical contacts with the reception layer 20. Further, the tunnel-injection device encompasses a plurality of gate insulating films 30 disposed on the barrier-forming layer 60 and a plurality of gate electrodes 40 disposed on the corresponding gate insulating film 30 configured to control the width of the barrier generated at the interface between the reception layer 20 and the barrier-forming layer 60 so as to change the tunneling probability of carriers through the barrier. Here, the barrier is the band-edge discontinuity barrier $\Delta Ec$, which will be explained later with referring to the energy band diagrams shown in FIGS. 2A to 2C.

Still further, the tunnel-injection device encompasses a carrier receiving region 10 being contact with the reception layer 20, configured to receive the carriers injected by tunneling through the barrier and a plurality of carrier-supplying regions 18 being contact with the corresponding barrier-forming layers 60. Each of the carrier-supplying regions 18 is connected to corresponding source electrodes 80, and supplies the carriers to the barrier-forming layer 60.

Although the cross-sectional view shows a plurality of separate gate electrodes 40 in FIG. 1, these gate electrodes 40 can merge into a single piece at a rearward portion of the paper (not illustrated) or at the near side (not illustrated) of the paper so as to form a comb shape or a grid shape, for example, in an actual plan view. Similarly, although the cross-sectional view shows a plurality of separate source electrodes 80 in FIG. 1, the source electrodes 80 can merge into single piece at a deep rearward portion of the paper (not illustrated) or at the near side of the paper so as to form a comb shape or a grid shape, for example, in an actual plan view. However, spatially isolated gate electrodes 40 and source electrodes 80 can also exist any way. The same argument can be applied to the following second to seventh embodiments, of course.

An $n^-$ type drift layer 20 laminated on an $n^+$ type SiC substrate serves as "the reception layer" in the first embodiment. Because the $n^-$ type drift layer 20 is made of SiC, as the first semiconductor, SiC is employed in the first embodiment. The $n^+$ type SiC substrate 10 serves as "the carrier receiving region", or a drain region in the first embodiment. The drift layer 20 transports the carrier to the carrier receiving region 10. As "the barrier-forming layers", $p^-$ type lightly doped poly crystalline silicon (hereinafter called "polysilicon") films 60 are laminated in predetermined regions on the drift layer 20. Therefore, polysilicon corresponds to the second semiconductor in the first embodiment. Therefore, a p-n heterojunction is formed between the $p^-$ type lightly doped polysilicon film 60 and the drift layer 20 made of SiC.

On-predetermined regions on the $n^-$ drift layer 20, a plurality of insulation film 70 are selectively formed. And, on the insulation films, $n^+$ type polysilicon films 18 serving as "the carrier-supplying regions" are disposed respectively. Each of the $n^+$ type polysilicon films 18 is connected to corresponding $p^-$ type lightly doped polysilicon film 60, which serves as barrier-forming layers. And the gate insulation films 30 are formed on the top surface of the corresponding p-type lightly doped polysilicon film 60. This gate insulation film 30 extends so as to cover regions over the drift layer 20 and the $n^+$ type polysilicon film 18.

As the first semiconductor, various wide bandgap semiconductors other than SiC can be employed in the first embodiment. Historically, early stage in semiconductor industry, silicon (Si) material having a bandgap energy Eg=1.1 eV, or the gallium arsenide (GaAs) material having a bandgap energy Eg=1.4 eV has been firstly adopted for practical use. Compared with these preceding semiconductor materials, other semiconductor materials having wider bandgap energy Eg than these Si and GaAs are now referred as "wide bandgap semiconductor". For example, zinc telluride (ZnTe) having a bandgap energy Eg=2.2 eV, cadmium sulfide (CdS) having a bandgap energy Eg=2.4 eV, zinc selenide (ZnSe) having a bandgap energy Eg=2.7 eV, a gallium nitride (GaN) having a bandgap energy Eg=3.4 eV, zinc sulphide (ZnS) having a bandgap energy Eg=3.7 eV and diamond having a bandgap energy Eg=5.5 eV are well known as the examples for the wide bandgap semiconductors.

SiC is one of the examples of wide bandgap semiconductor. And, various stacking sequence, or the polytypes of the SiC are known. Although, as the stacking sequence of the SiC, a hexagonal 4H polytype may be representative, a hexagonal 6H polytype, a cubic 3C polytype or any other polytypes can be used in the first embodiment. The bandgap energy Eg of 2.23 eV is reported for 3C—SiC, 2.93 eV is reported for 6H—SiC, and 3.26 eV is reported for 4H—SiC. If we use 4H—SiC as the first semiconductor, semiconductor materials having bandgap energy Eg narrower than 3.26 eV, such as 6H—SiC, ZnSe, CdS, 3C—SiC, ZnTe, GaAs, Si, germanium (Ge) can be used for the second semiconductor. If we use diamond as the first semiconductor, semiconductor materials having bandgap energy Eg narrower than 5.5 eV, such as ZnS, GaN, 6H—SiC, ZnSe, CdS, 3C—SiC, ZnTe, GaAs, Si, Ge can be used for the second semiconductor. If we use Si as the first semiconductor, semiconductor materials having bandgap energy Eg narrower than 1.1 eV, such as Ge, mercury cadmium telluride (HgCdTe) can be used for the second semiconductor. Exactly same argument can be hold in following second to seventh embodiments, of course.

For the condition that the reception layer 20 made of the first semiconductor can implement the p-n heterojunction with the first semiconductor so that the p-n heterojunction can serve as the constituent element of the switching device, it is necessary that a bandgap of the second semiconductor mating to the first semiconductor is narrower than the bandgap of the first semiconductor—the reason will be understood from the discussion bellows. On the contrary, if the bandgap of the second semiconductor for the p-n heterojunction is larger than the bandgap of the first semiconductor, it does not function as the switching device. Therefore, the bandgap of the second semiconductor configured to implement the p-n heterojunction must be narrower than the bandgap of the first semiconductor.

If SiC is adopted as the first semiconductor, the favorable examples for the second semiconductor, or the narrower bandgap semiconductor, single crystalline silicon, polysilicon, or amorphous silicon can be used, because the deposition of the single crystalline silicon, the amorphous silicon or the polysilicon on the SiC substrate 10 is easy. Furthermore, by employing the single crystalline silicon, the amorphous silicon or the polysilicon, the process of oxidations, photolithographic delineations, various selective etchings, or various selective dopings can be executed easily.

Figure 2A:
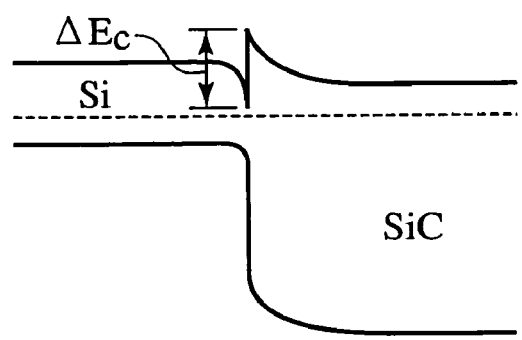
FIGS. 2A to 2C are energy band diagrams showing band-edge discontinuity barrier formed at an interface of p-n heterojunction for explaining the operation of the tunnel-injection devices of the first to third embodiments of the present invention.
Figure 2B:
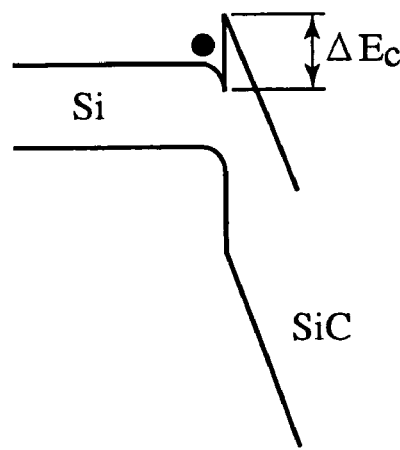
Figure 2C:
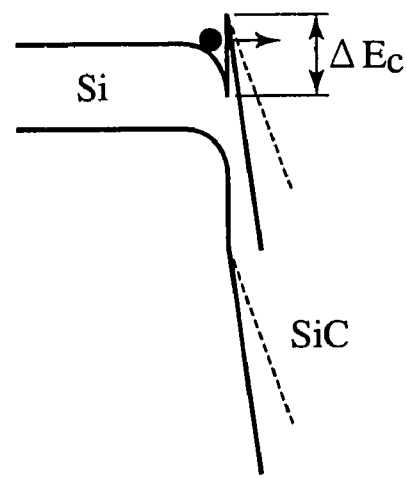

1.2 Operation of Tunnel-Injection Device of First Embodiment:

By means of the energy band diagram shown in FIG. 2A to FIG. 2C, the behavior of the p-n heterojunction between n⁻ type SiC serving as the drift layer 20 and p⁻ type polysilicon will be explained in detail. In each energy band diagram of FIG. 2A to FIG. 2C, the energy band of the p type silicon is shown in the left, and the energy band diagram of the n⁻ type SiC corresponding to the drift layer 20 is shown on the right side. In this explanation, in order that the behavior of the p-n heterojunction can be easily understood, an ideal energy band diagram is illustrated, in which there is no interface state in the p-n heterojunction interface.

The tunnel-injection device shown in FIG. 1 contains the junction interface between the p⁻ type silicon and the n⁻ type SiC. As shown in FIG. 2, there is an energy barrier ΔEc ascribable to the difference of electron affinity of both silicon and SiC in the junction interface. The device operates under a bias condition such that the source electrode 80 is grounded and a positive voltage is applied to the drain electrode 90. A characteristic of the element manifests a reverse bias characteristic of a p-n heterojunction diode, implemented by the p⁻ type lightly doped polysilicon film 60 and the SiC drift layer 20. In other words, in the drift layer 20, a depletion layer extends depending on the drain voltage. On the other hand, the electrons, which are minority carriers, accumulate in the junction interface in the p⁻ type lightly doped polysilicon film 60, because the electrons do not have energy to surmount the energy barrier ΔEc, as shown in FIG. 2B. And electric field lines establishing the depletion layer extending in the drift layer 20 terminate at the accumulation layer of electrons, and the electric field is shielded in the p⁻ type lightly doped polysilicon film 60. Accordingly, the p⁻ type lightly doped polysilicon film 60 does not cause the breakdown first, but current suddenly flows from the drain electrode 90 to the source electrode 80 when the drain voltage increases to a predetermined voltage. In addition, in a reverse bias characteristic of the p-n heterojunction diode, which has been explained above, even if the thickness of the p⁻ type lightly doped polysilicon film 60 is thinned to around 20 nm, for example, it is confirmed experimentally that a withstanding voltage of more than 300V can be achieved. Accordingly, in the tunnel-injection device according to the configuration of the first embodiment, even if the thickness of the narrower bandgap semiconductor region is made thin, by the effect that the electric field is shielded in the p⁻ type lightly doped polysilicon film 60, there is no fear that punch through might happen.

Because the channel length can be shortened to the thickness of the narrower bandgap semiconductor region, or around 20 nm, for example, the channel resistance can be made remarkably small. On the other hand, when a positive voltage is applied to the gate electrode 40, the p⁻ type lightly doped polysilicon film 60 develops the strong inversion condition, and the n⁺ type channel layer is formed on the top surface. Furthermore, the electric field affects on the p-n heterojunction interface between the p⁻ type lightly doped polysilicon film 60 and the SiC drift layer 20, the thickness of the energy barrier ΔEc implemented by the p-n heterojunction interface is thinned by the electric field concentration, as shown in FIG. 2C. The dotted line is an energy level before application of the gate voltage, and the solid line shows the energy level after the application of the gate voltage. As a result, even if the drain voltage is below the predetermined voltage, the tunneling phenomenon occurs, and current begins to flow. In other words, in the tunnel-injection device according to the first embodiment, under a bias condition that the drain voltage is kept below the breakdown voltage, by applying a positive voltage to the gate electrode 40, the current flowing between the drain electrode 90 and the source electrode 80 is controlled.

In this tunnel-injection device, a switching device manifesting high-speed and high breakdown voltage is implemented by a simple configuration, using a p-n heterojunction composed of SiC and a narrower bandgap semiconductor than SiC. Because crystallographic defect levels are low in the junction interface of the narrower bandgap semiconductor region and the gate insulation film 30, in which a channel is formed, carriers can be transported through the channel without being influenced by the interface states. Furthermore, because there is no fear of the occurrence of the punch through, even if the thickness of the narrower bandgap semiconductor region serving as the channel is reduced, the channel length can be shortened to 20 nm. Here, "the channel length" is defined as the length of the second conductivity type narrower bandgap semiconductor region, measured from the drift layer 20 to the first conductivity type narrower bandgap semiconductor region. Therefore, the channel resistance can be reduced remarkably. Furthermore, the impurity doping by the ion implantation of high energy is not required in manufacturing of the basic configuration of the tunnel-injection device. As a result, impurity-activation-annealing to be executed at temperature of more than 1500 degrees Celsius, which also serves as the recovery process of the crystallographic quality is unnecessary. The load of a fabrication-process can be reduced, in addition to the technical advantage that the deterioration of the surface morphology occurring in the high temperature anneal can be avoided.

In the device shown in Japanese Patent Laid-Open-no. 10-233503, because it is necessary to form a deep diffusion region in order to form the p− type body region in the n− type SiC drift layer, the impurity doping by the ion implantation of high energy is indispensable. When a high-energy ion implantation is executed, defects are generated in the SiC drift layer, which will cause the increase of leakage current. In addition, for impurities activation, serving as the recovery process of crystallographic quality, a high temperature anneal at temperature of more than 1500 degrees Celsius, for example, is necessary, which cause a problem in that the surface morphology becomes poor after the high temperature anneal. With the first embodiment of the present invention, the problem in the device shown in Japanese Patent Laid-Open-no. 10-233503 can be easily solved so that a voltage drive type, normally-off tunnel-injection device can be manufactured by a simple fabrication-process.

1.3 Manufacturing Method of Tunnel-Injection Device of First Embodiment:

Next, an example of a manufacturing method of the tunnel-injection device of the first embodiment is explained by means of sectional views of FIG. 3A to FIG. 3H.

Figure 3A:
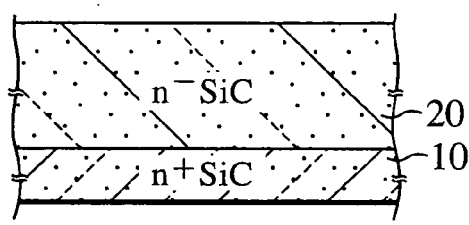
FIGS. 3A to 3H are process sectional views of the tunnel-injection device shown in FIG. 1.

(a) At first, a base body (20, 10) made of a first semiconductor is prepared. That is, as shown in FIG. 3A, on a n+ type SiC substrate 10, an n− type SiC drift layer 20 having an impurity concentration of $10^{14}$–$10^{18}$ cm$^{-3}$, and thickness of 1–400 μm, is formed, for example. Then, by thermal oxidation, a sacrificial silicon oxide film is formed on the drift layer 20.

Figure 3C:
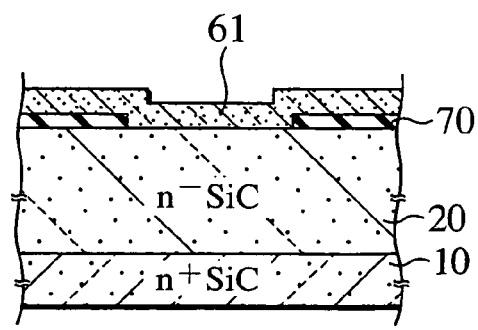
Figure 3B:
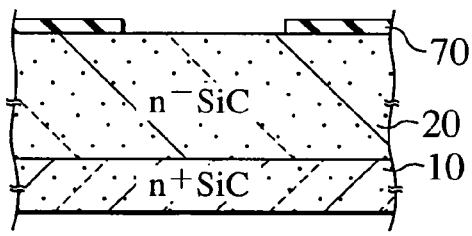
Figure 3D:
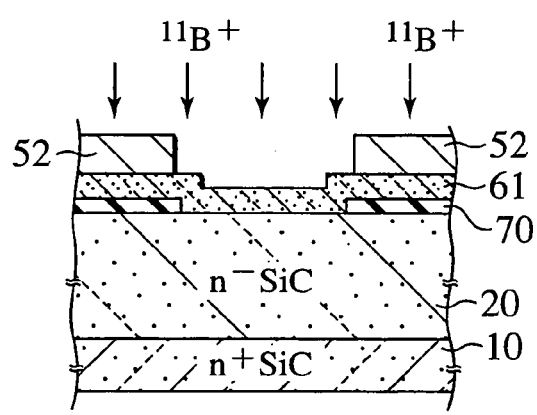
Figure 3E:
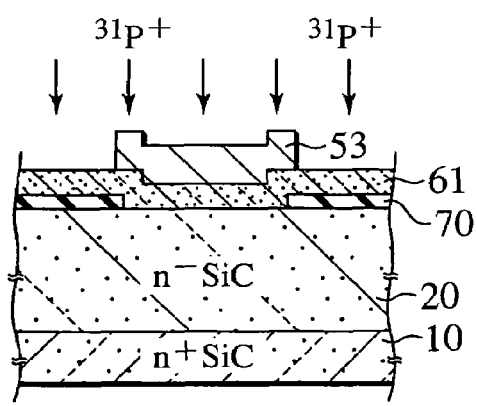

(b) After removing the sacrificial silicon oxide film, a new silicon oxide film having a thickness of 0.01–10 μm is deposited by CVD method. By the photolithographic delineation of the new silicon oxide film, insulation films 70 are formed as shown in FIG. 3B. A polysilicon film 61 having a thickness of 0.1–10 μm is deposited on the insulation films 70 by reduced pressure CVD method, for example, as shown in FIG. 3C.

(c) Afterwards, desired impurities are doped into this polysilicon film 61 so as to form the p− type lightly doped polysilicon film 60 and the n+ type polysilicon film 18, respectively. As an example of this doping technology, a method when a heavily doped CVD film is deposited on top of the polysilicon film, and by annealing at temperature of 600–1000 degrees Celsius, impurities doped in the CVD film thermally diffuse into the polysilicon film may be employed. Or, boron ions ($^{11}$B+) may be selectively implanted through the implantation mask 52 into the polysilicon film 61 so as to form the p− type lightly doped polysilicon film 60 as shown FIG. 3D. Furthermore, phosphorous ions ($^{31}$P+) may be selectively implanted through the implantation mask 53 into the polysilicon film 61 so as to form the n+ type polysilicon film 18 as shown FIG. 3E. Actually, after the activation-annealing, the p− type lightly doped polysilicon film 60 and the n+ type polysilicon film 18, are formed as shown FIG. 3F. In addition, in order to improve the carrier mobility in the polysilicon film 61, the polysilicon film 61 may be annealed so as to achieve single crystallization or to increase the grain size of the polysilicon. Furthermore, the polysilicon film 61 may be single crystallized by laser light irradiation.

Figure 3G:
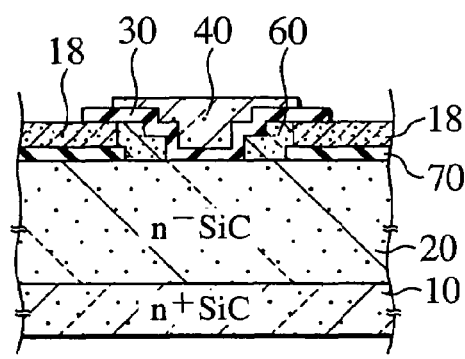
Figure 3F:
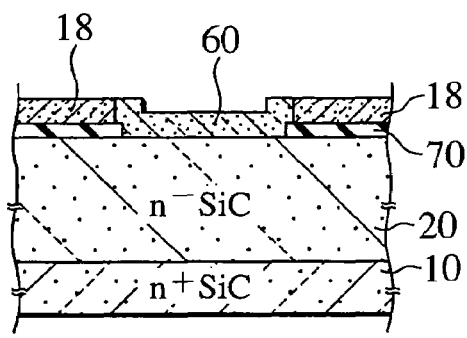

(d) As shown in FIG. 3G, a gate insulation film 30 is formed, for example, by CVD method. On the gate insulation film 30, a new polysilicon film 40 having a thickness of 0.1 to 10 μm is deposited by means of the reduced pressure CVD (RPCVD) method. Desired impurities are doped in this polysilicon film 40 afterwards. And by the photolithographic delineation of the polysilicon film, a plurality of gate electrodes 40 are cut.

Figure 3H:
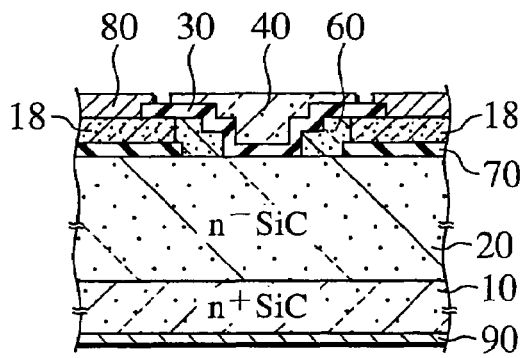

(e) As shown in FIG. 3H, source electrodes 80 are formed so as to contact with the n+ type polysilicon film 18. A metallic film is deposited as a drain electrode 90 on the back surface of the SiC substrate 10. By annealing at a temperature of around 600–1300 degrees Celsius, for example, the source electrodes 80 and the drain electrode 90 becomes ohmic electrodes. In this way the tunnel-injection device shown in FIG. 1 is completed.

Figure 4:
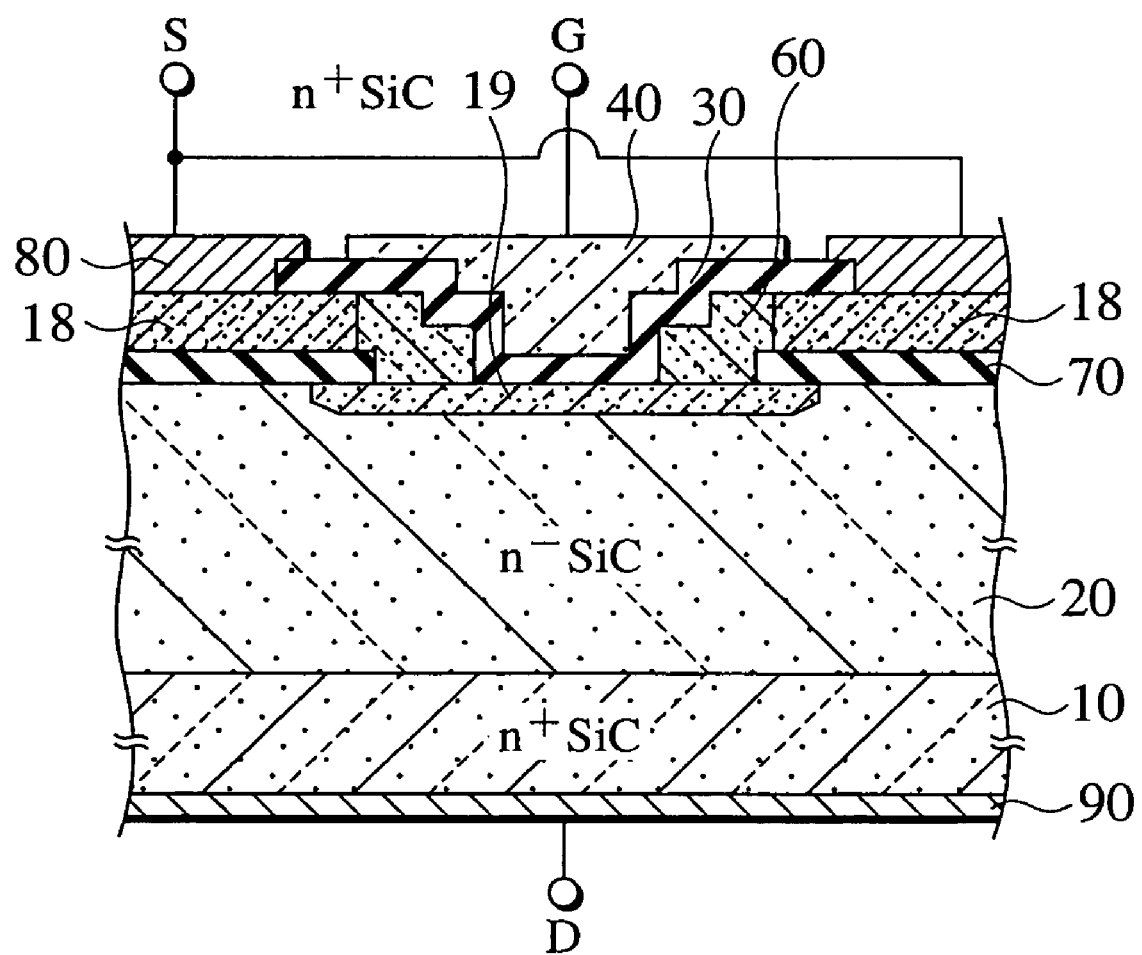
FIG. 4 is a cross sectional view of a tunnel-injection device of a first modification of the first embodiment of the present invention.

1.4 First Modification of First Embodiment:

FIG. 4 shows a tunnel-injection device associated with a first modification of the first embodiment. The difference from the configuration shown in FIG. 1 lies in the configuration such that an n+ type heavily doped SiC region 19 is sandwiched in between a portion of the p− type lightly doped polysilicon film 60 and the n− type drift layer 20, the portion being adjacent to the gate insulation film 30. That is, in first modification of the first embodiment, the reception layer 20 embraces the heavily doped region 19 being metallurgical contacting with the barrier-forming layer 60 and the drift layer 20 having impurity-doping level lower than the heavily doped region 19, being in metallurgical contact with the heavily doped region 19.

In other word, the n+ type heavily doped SiC region 19 is also sandwiched in between a portion of the gate insulation film 30 and the n− type drift layer 20. When the p− type lightly doped polysilicon film 60 contacts to the n+ type SiC region so as to implement the p-n heterojunction, in addition to the effectiveness in that there are many carriers in the n+ type SiC region, because the width of the depletion layer extending in the n+ type SiC region narrows, the thickness of the energy barrier ΔEc shown in FIGS. 2A–2C becomes thinner. As a result, because the tunneling current can penetrate the barrier at lower gate voltage, the control of the main current by the gate voltage becomes easy. In other words, the tunnel-injection device according to the first modification of the first embodiment achieves, in addition to the technical advantage achieved by the basic configuration shown in FIG. 1, a further technical advantage such that the control performance of the main current of the tunnel-injection device by the gate voltage is improved. Although the breakdown voltage between the p− type lightly doped polysilicon film 60 and the n+ type SiC region 19 is low, by a field plate effect, because the depletion layer extends into the n− type drift layer 20 from the bottom surface of the insulation films 70, and because the electric field applied across the junction between the p− type lightly doped polysilicon film 60 and the n+ type SiC region 19 is shielded by the depletion layer, the decrease of the drain breakdown voltage can be prevented.

Other structure and materials are similar to the structure and materials already explained by the basic configuration shown in FIG. 1, and overlapping or redundant description may be omitted in the first modification of the first embodiment.

Figure 5:
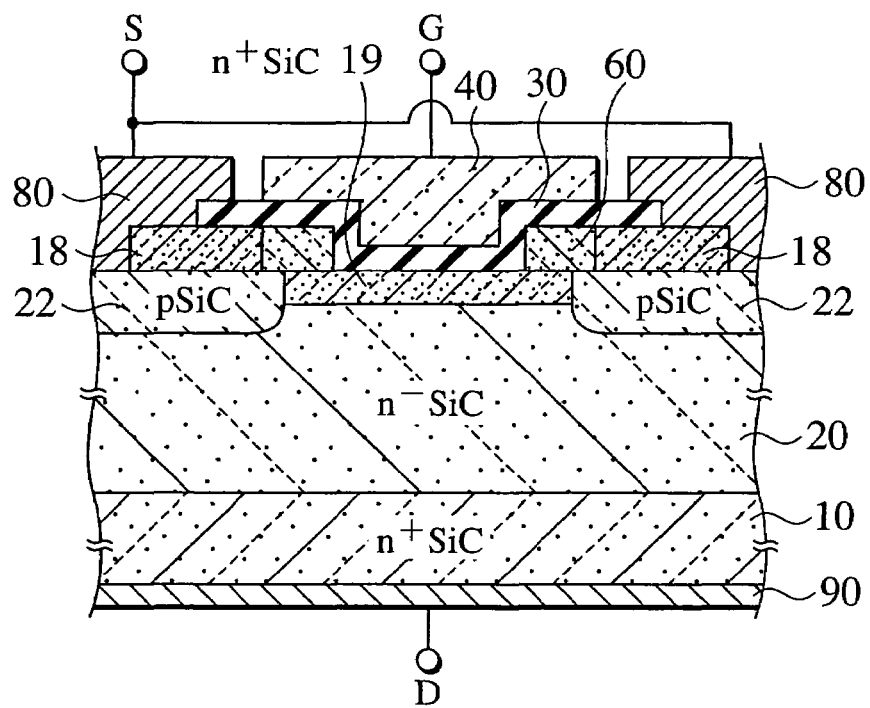
FIG. 5 is a cross sectional view of a tunnel-injection device of a second modification of the first embodiment of the present invention.

1.5 Second Modification of First Embodiment:

FIG. 5 shows a tunnel-injection device associated with a second modification of the first embodiment. The difference from FIG. 4 lies in the configuration such that in a part of the SiC drift layer 20 just under the n$^+$ type polysilicon film 18, p$^+$ type SiC buffering regions 22 connected to source electrodes 80 are buried. In the second modification of the first embodiment, the depletion layer can be extended from the p$^+$ type SiC buffering regions 22 into the n type drift layer 20. The width of the depletion layer is wider than the depletion layer associated with the field-plate effect manifested by the first modification of the first embodiment. Because the electric field across the junction between the p$^-$ type lightly doped polysilicon film 60 and the n$^+$ type SiC region 19 is shield by the depletion layer, the decrease of the drain breakdown voltage can be prevented.

Further, because the electric field applied to the gate insulation film 30 is relaxed, the reliability of the gate insulation film 30 improves. As explained above, in the second modification of the first embodiment, in the surface of the first conductivity type drift layer 20 facing the gate electrode 40 through the gate insulation film 30, the second conductivity type buffering regions 22 are formed. By the second conductivity type buffering regions 22, the breakdown voltage of the tunnel-injection device can be prescribed by the reverse breakdown voltage of the diodes implemented by the buffering regions 22 and the drift layer 20, the tunnel-injection device having a high breakdown voltage can be provided.

Although, the example in which the p$^+$ type SiC buffering regions 22 are connected to the source electrodes 80 is explained in the second modification of the first embodiment, the buffering regions 22 are not always required to be connected to the source electrodes 80.

Other structure and materials are similar to the structure and materials already explained by the basic configuration shown in FIG. 1, and overlapping or redundant description may be omitted in the second modification of the first embodiment.

Figure 6:
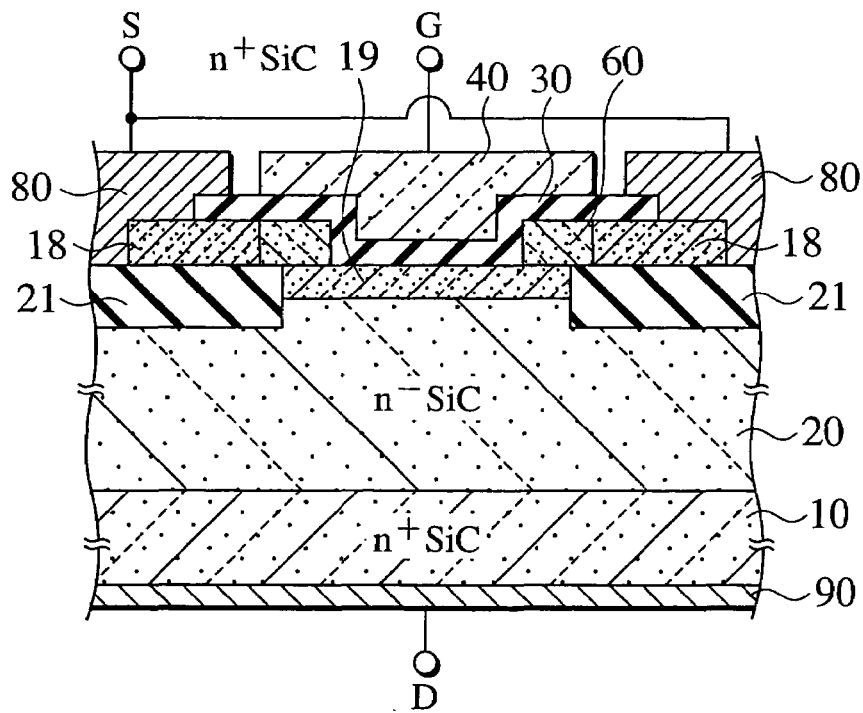
FIG. 6 is a cross sectional view of a tunnel-injection device of a third modification of the first embodiment of the present invention.

1.6 Third Modification of First Embodiment:

FIG. 6 shows a tunnel-injection device associated with a third modification of the first embodiment. The difference from FIG. 5 lies in a configuration in which dielectric films 21 are buried in the SiC drift layer 20, at portions just under the n$^+$ type polysilicon film 18.

By adopting the configuration of the third modification of the first embodiment, the depletion layers are extended in the n$^+$ type SiC region 19 at deeper position so that an electric field across the junction between the p$^-$ type lightly doped polysilicon film 60 and the n$^+$ type SiC region 19 can be shielded easily. As a result, a decrease of a drain breakdown voltage can be prevented effectively. In addition, the reliability of the gate insulation film 30 improves as the electric field applied to the gate insulation film 30 is relaxed.

The manufacturing method for the tunnel-injection device of the third modification of the first embodiment differs from the second modification of the first embodiment in that the impurity doping by the high-energy ion implantation is not required. As a result, activation-annealing of impurity ions at temperature of more than 1500 degrees Celsius that served as the recovery process of crystallographic quality is unnecessary, the load of the fabrication-process is reduced and the deterioration of the surface morphology occurring in the high temperature anneal can be avoided.

Other structure and materials are similar to the structure and materials already explained by the basic configuration shown in FIG. 1, and overlapping or redundant description may be omitted in the third modification of the first embodiment.

Figure 7:
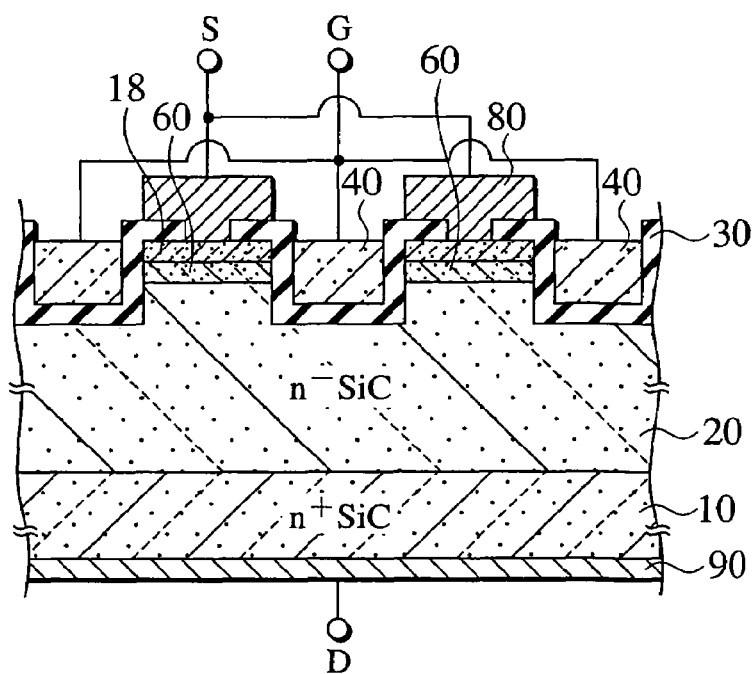
FIG. 7 is a cross sectional view showing a part of a tunnel-injection device of a second embodiment of the present invention.

2. Second Embodiment 2.1 Basic Configuration of Second Embodiment:

As shown in FIG. 7 a tunnel-injection device associated with a second embodiment of the present invention encompasses a reception layer 20 having a periodic recessed structure at the top surface and a plurality of barrier-forming layers 60, each being in metallurgical contact with the reception layer 20 at the protruding potion of the recessed structure. Similar to the first embodiment, the reception layer 20 is made of a first semiconductor and barrier-forming layer 60 is made of a second semiconductor having a bandgap narrower than the first semiconductor. Here, p$^-$ type lightly doped polysilicon film 60 serves as the barrier-forming layer because the reception layer 20 is made of SiC, for example.

As shown in FIG. 7, a plurality of gate insulating films 30 are disposed on the barrier-forming layer 60 at the peripheral edge of the gate insulating films, respectively. The gate insulating films 30 are also disposed in the periodic grooves of the recessed structure. And a plurality of gate electrodes 40 are embedded in the grooves so that each of the gate electrodes 40 can control the width of the band-edge discontinuity barrier generated at the interface between the reception layer 20 and the barrier-forming layer 60 so as to change the tunneling probability of carriers through the barrier. The gate electrodes 40 are embedded, to a depth lower than the bottom surface of the barrier-forming layer 60, in predetermined regions of the recessed drift layer 20. Therefore, Each of the p$^-$ type lightly doped polysilicon films 60 is sandwiched by the gate electrodes 40 through the gate insulating film 30.

FIG. 7 shows cross-sectional views of adjacent two unit cells in the multi-channel structure. In the multi-channel structure, the embedded gate electrodes 40 and the sandwiching source electrodes 80 are mutually arranged in parallel so as to implement an interdigital topology. The gate electrodes 40 and source electrodes 80 are respectively delineated in stripe geometries in a plan view.

In the second embodiment of the present invention, a plurality of carrier-supplying regions 18 are stacked on the corresponding barrier-forming layers 60, and supply the carriers to the barrier-forming layer 60. Each of the carrier-supplying regions 18 is made of n$^+$ type polysilicon films. And a plurality of source electrodes 80 are stacked on the carriers to the barrier-forming layer 60, so that the n$^+$ type polysilicon films 18 can be connected to the corresponding source electrodes 80.

Then, a plurality of p-n heterojunctions are implemented by the p$^-$ type lightly doped polysilicon films 60 and the SiC drift layer 20, respectively. Each of the p-n heterojunctions generates the energy barrier ΔEc at the junction interface as shown in the energy band diagram of FIG. 2A.

Other structure and materials are similar to the structure and materials already explained in the first embodiment, and overlapping or redundant description may be omitted in the second embodiment.

In addition to the technical advantage as stated in the first embodiment, the area efficiency of the tunnel-injection device is raised by the recessed-gate structure, and the reduction of the on-state resistance and the miniaturization of the tunnel-injection device are possible. Because the second conductivity type narrower bandgap semiconductor region 60 and the first conductivity type narrower bandgap semiconductor region 18 can be laminated, it is easy to make the second conductivity type narrower bandgap semiconductor region 60 thinner so as to implement a structure being effective in shortening the channel length. Furthermore, by a topology in which the gate insulation film 30 is formed perpendicular to the p-n heterojunction interface, the length of the electric field lines from the gate electrode 40 to the p-n heterojunction interface can be shortened. Therefore, the control of thickness of the energy barrier $\Delta Ec$ by the electric field from the gate electrode 40 can be further improved. As a result, tunneling current penetrating the barrier can be injected at lower gate voltage, and control of the main current by the gate voltage becomes easy.

2.2 Operation of Tunnel-Injection Device of Second Embodiment:

The operation of this tunnel-injection device is basically similar to the first embodiment shown in FIG. 1. In other words, the tunnel-injection device operates under a bias condition such that the source electrodes 80 are grounded and a positive voltage is applied to the drain electrode 90. And when the gate electrodes 40 are grounded, the characteristic of the tunnel-injection device becomes a reverse bias characteristic of the p-n heterojunction diode implemented by the p⁻ type lightly doped polysilicon film 60 and the SiC drift layer 20. On the other hand, when a positive voltage is applied to the gate electrodes 40, the p⁻ type lightly doped polysilicon films 60 develop a strong inversion condition, and n⁺ type layers are formed in the top surfaces of the p⁻ type lightly doped polysilicon films 60.

Furthermore, as the electric field acts on the p-n heterojunction interface between the p⁻ type lightly doped polysilicon films 60 and the SiC drift layer 20, the thickness of the energy barrier $\Delta Ec$ implemented by the p-n heterojunction interface is thinned by the electric field concentration. As a result, even if the drain voltage is less than the predetermined voltage, the tunneling process occurs so that current begins to flow.

There are two structural differences between the first embodiment shown in FIG. 1 and the second embodiment shown in FIG. 7. Firstly, the p⁻ type lightly doped polysilicon films 60 and the n⁺ type polysilicon films 18 are laminated. Secondly, grooves penetrating through the p⁻ type lightly doped polysilicon films 60 and the n⁺ type polysilicon films 18 in the depth direction are facilitated so that the recessed-gate structure implemented by the gate electrodes 40 in the groove can be established. By the application of the recessed-gate structure explained in the second embodiment, the area efficiency of the tunnel-injection device is raised, and the reduction of the on-state resistance and the miniaturization of the tunnel-injection device are possible.

In addition, because the p⁻ type lightly doped polysilicon films 60 and the n⁺ type polysilicon films 18 can be laminated, it is easy to make the thickness of the p⁻ type lightly doped polysilicon films 60 thin so as to implement the structure effective in shortening the channel length. Furthermore, by the topology in which the gate insulation film 30 is perpendicular to the p-n heterojunction interface direction, the length of the electric field lines from the gate electrodes 40 to the p-n heterojunction interface can be shortened. Therefore, the control performance of the thickness of the energy barrier $\Delta Ec$ by the electric field from the gate electrodes 40 can be further improved. As a result, current tunneling through the barrier can be injected at lower gate voltage, and the control of the main current by the gate voltage becomes easy.

2.3 Manufacturing Method of Tunnel-Injection Device of Second Embodiment:

Next, an example of the manufacturing method of the tunnel-injection device of the second embodiment will be explained with sectional views of FIG. 8A to FIG. 8E.

Figure 8A:
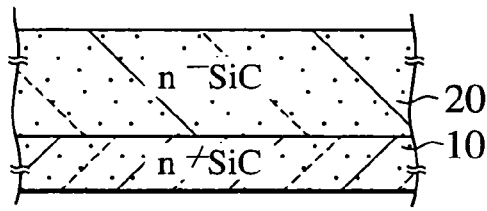
FIGS. 8A to 8E are process sectional views of the tunnel-injection device shown in FIG. 7.

(a) At first, as shown in FIG. 8A, on an n⁺ type SiC substrate 10, an n⁻ type SiC drift layer 20 having an impurity concentration of, for example, $10^{14}$–$10^{18}$ cm⁻³, a thickness of 1–100 μm is formed.

(b) By thermal oxidation, a sacrificial silicon oxide film is formed on the drift layer 20. After removing the sacrificial silicon oxide film, a polysilicon film having a thickness of 0.1–10 μm, for example is deposited by means of a RPCVD method, and desired impurities are doped in this polysilicon film, so as to produce the p⁻ type lightly doped polysilicon films 60 as shown in FIG. 8B.

(c) Next, by the RPCVD method, another polysilicon film 18 having a thickness of 0.1–10 μm, for example, is laminated on the p⁻ type lightly doped polysilicon films 60. By impurity doping in the polysilicon film, the n⁺ type polysilicon film 18 is formed as shown in FIG. 8B. As a method for doping desired impurities in the polysilicon film, a heavily doped CVD film is deposited on the top of the polysilicon film so that the impurities in the CVD film are thermally diffused into the polysilicon film by an anneal of around 600–1000 degrees Celsius. Or, by ion implantation, the polysilicon film can be doped directly with impurities. In order to improve carrier mobility in the polysilicon film, an annealing of the polysilicon film may be executed, for example, so that the single crystallization can be achieved or so that the grain size of polysilicon can be enlarged. Furthermore, by irradiating laser light on the polysilicon film, the crystallization can be facilitated.

Figure 8D:
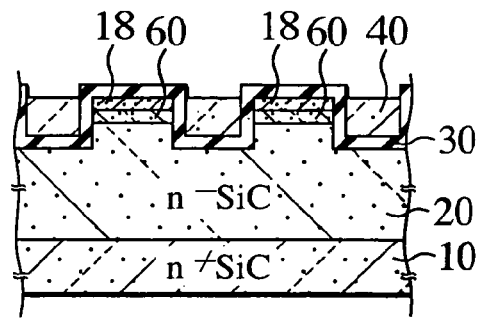
Figure 8B:
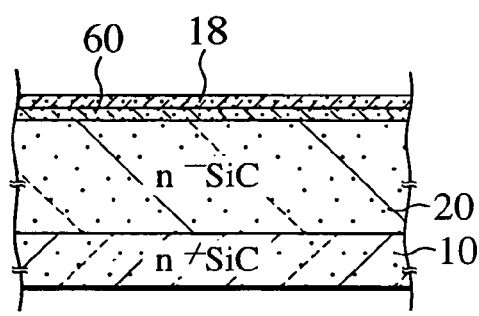
Figure 8E:
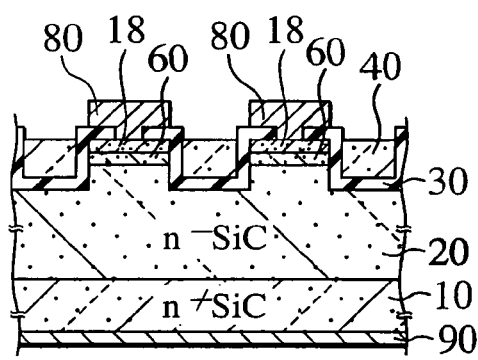
Figure 8C:
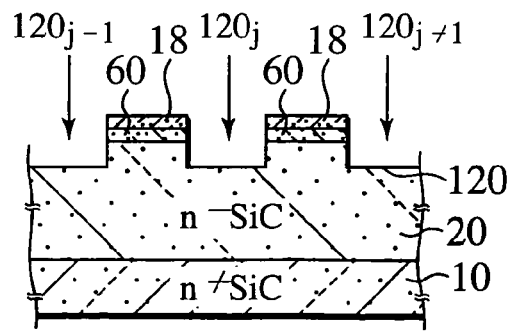

(d) As shown in FIG. 8C, a plurality of grooves $120_{j-1}$, $120_j$, $120_{j+1}$, . . . each having depth of 0.1–10 μm are formed along the depth direction, for example, penetrating the n⁺ type polysilicon film 18 and the p⁻ type lightly doped polysilicon films 60 until the n⁻ type drift layer 20 is reached.

(e) As shown in FIG. 8D, a gate insulation film 30 is formed by, for example, CVD method, and on the gate insulation film 30, a new polysilicon film 40 having a thickness of, for example, 0.1–10 micrometer, is deposited by means of the RPCVD method.

(f) Desired impurities are doped in this polysilicon film 40 afterwards. By the photolithographic delineation of this polysilicon film, a plurality of gate electrodes 40 are formed in the grooves $120_{j-1}$, $120_j$, $120_{j+1}$, . . . .

(g) As shown in FIG. 8E, source electrodes 80 are formed so as to contact with the n⁺ type polysilicon films 18. A metallic film is deposited as a drain electrode 90 on the back surface of a SiC substrate 10. By annealing at temperature of around 600–1300 degrees Celsius, for example, ohmic electrodes serving as the source electrodes 80 and the drain electrode 90 are established. In this way the tunnel-injection device shown in FIG. 7 is completed.

Figure 9:
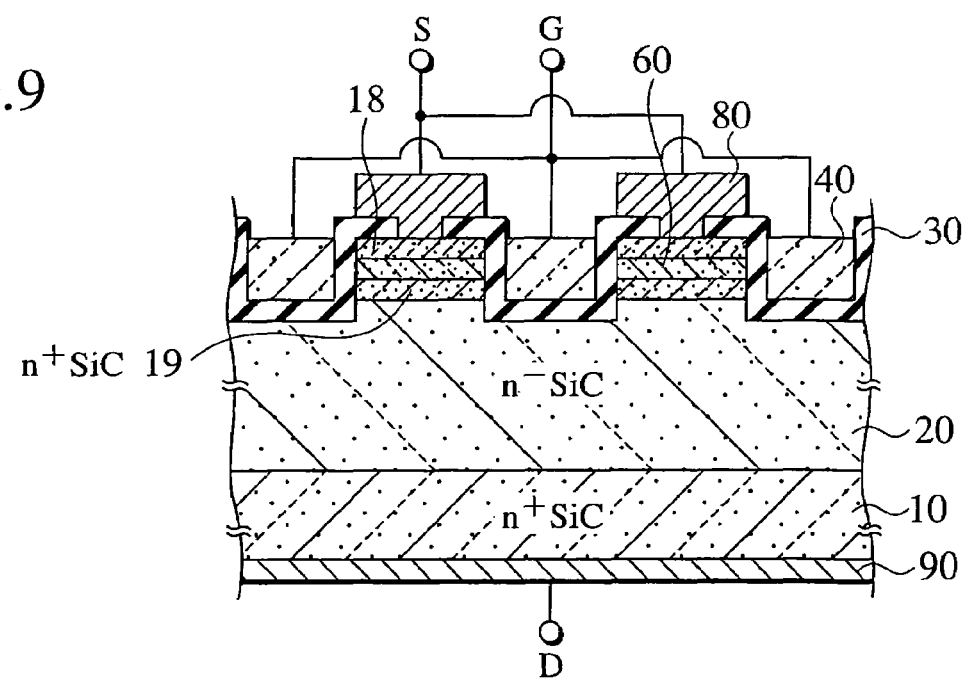
FIG. 9 is a cross sectional view of a tunnel-injection device of a first modification of the second embodiment of the present invention.

2.4 First Modification of Second Embodiment:

FIG. 9 shows a tunnel-injection device associated with a first modification of the second embodiment. The difference from FIG. 7 lies in a configuration, in which a plurality of $n^+$ type SiC regions 19 are formed in parts of the SiC drift layer 20 just under the $p^-$ type lightly doped polysilicon films 60. That is, in first modification of the second embodiment, the recessed reception layer 20 embraces the heavily doped region 19 being metallurgical contacting with the barrier-forming layer 60.

By the structure that the drift layer 20 having impurity-doping level lower than the heavily doped region 19, is in metallurgical contact with the heavily doped region 19 so that the $n^+$ type SiC regions 19 can implement the p-n heterojunctions with the $p^-$ type lightly doped polysilicon films 60, in addition to the behavior whereby a large number of carriers exist in the $n^+$ type SiC regions 19, because the width of the depletion layer extending in the $n^+$ type SiC regions 19 is reduced, the thickness of the energy barrier $\Delta Ec$ is made thinner. As a result, since the tunneling current can-penetrate the barrier at lower gate voltage, the control of the main current by the gate voltage becomes easy. In other words, by the tunnel-injection device of the first modification of the second embodiment, in addition to the technical advantage as explained in the basic configuration of the second embodiment, a technical advantage such that the control performance of main current of the tunnel-injection device by the gate voltage improves is achieved.

Although the breakdown voltage of the $p^-$ type lightly doped polysilicon films 60 and the $n^+$ type SiC regions 19 is low, because depletion layers extend from portions just under the gate insulation film 30 into the $n^-$ type drift layer 20 by the field-plate effect, the electric field across the junction between the $p^-$ type lightly doped polysilicon films 60 and the $n^+$ type SiC region 19 is shielded, and the decrease of the drain breakdown voltage can be prevented.

Other structure and materials are similar to the structure and materials already explained by the basic configuration shown in FIG. 7, and overlapping or redundant description may be omitted in the first modification of the second embodiment.

Figure 10:
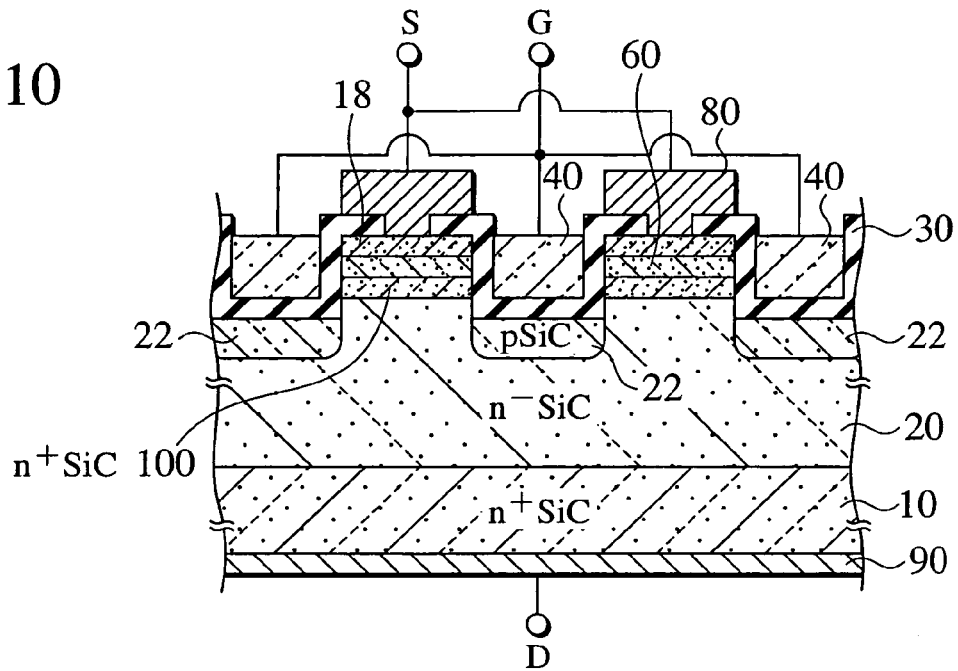
FIG. 10 is a cross sectional view of a tunnel-injection device of a second modification of the second embodiment of the present invention.

2.5 Second Modification of Second Embodiment:

FIG. 10 shows a tunnel-injection device associated with a second modification of the second embodiment. The difference from FIG. 9 lies in a configuration such that in parts of the SiC drift layer 20 just under the gate insulation film 30 disposed at the bottom of the groove, a plurality of $p^+$ type SiC buffering regions 22 are buried. In the second modification of the second embodiment, in comparison with the electric field shield effect by the field-plate effect explained in the first modification of the second embodiment, depletion layers can be extended respectively from the $p^+$ type SiC buffering regions 22 into the $n^-$ type drift layer 20 even further. Because the electric field across the junction between the $p^-$ type lightly doped polysilicon films 60 and the $n^+$ type SiC regions 19 is shielded, the decrease of the drain breakdown voltage can be prevented. In addition, because the electric field applied to the gate insulation film 30 disposed at the bottom of the groove is relaxed, the reliability of the gate insulation film 30 improves.

In addition, in the second modification of the second embodiment, the $p^+$ type SiC buffering regions 22 can be connected to the source electrodes 80 in the depth direction of the paper that is not illustrated.

Other structure and materials are similar to the structure and materials already explained by the basic configuration shown in FIG. 7, and overlapping or redundant description may be omitted in the second modification of the second embodiment.

Figure 11:
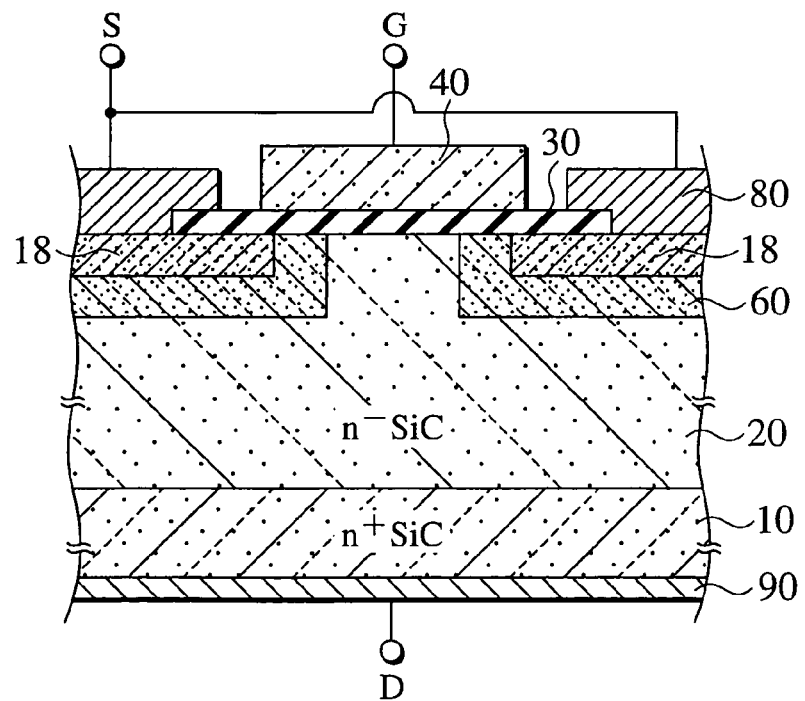
FIG. 11 is a cross sectional view showing a part of a tunnel-injection device of a third embodiment of the present invention.

3. Third Embodiment 3.1 Basic Configuration of Third Embodiment:

As shown in FIG. 11, a tunnel-injection device associated with a third embodiment of present invention encompasses a reception layer 20 and a barrier-forming layer 60 buried in the reception layer 20 at the top surface of the reception layer 20. Similar to the first and second embodiments, reception layer 20 is made of a first semiconductor, and the barrier-forming layer 60 is a second semiconductor having a bandgap narrower than the first semiconductor. Each of the buried barrier-forming layer 60 is metallurgical contact with the reception layer 20

Further as shown in FIG. 11, a plurality of carrier-supplying regions 18 buried in corresponding barrier-forming layers 60 so that each of the carrier-supplying regions 18 can contact with the barrier-forming layer 60, and they supply the carriers to the corresponding barrier-forming layer 60. And a gate insulating film 30 is disposed on the barrier-forming layer 60. The gate insulating film 30 extends over the carrier-supplying regions 18. A gate electrode 40 is disposed on the gate insulating film 30. Both of the peripheral edges of the gate electrode 40 lies above the portion of the barrier-forming layer 60 sandwiched by the reception layer 20 and the carrier-supplying region 18 so that the gate electrode 40 can control the width of the band-edge discontinuity barrier generated at the interface between the reception layer 20 and the barrier-forming layer 60. Then the gate electrode 40 can change the tunneling probability of carriers through the band-edge discontinuity barrier.

In the third embodiment of present invention, since the reception layer 20 is made of $n^-$ type SiC, the barrier-forming layer 60 buried in the reception layer 20 is made of $p^-$ type lightly doped polysilicon films. The $n^-$ type SiC reception layer may be assigned as an $n^-$ type drift layer 20. Therefore, the buried $p^-$ type lightly doped polysilicon films 60 and the $n^-$ type SiC drift layer 20 can implement the p-n heterojunction, and there is an energy barrier $\Delta Ec$ in the junction interface as shown in the energy band diagram of FIG. 2A. As the carrier-supplying region 18, $n^+$ type polysilicon film is employed, so that the $n^+$ type polysilicon films 18 can be buried in the $p^-$ type lightly doped polysilicon film 60. On the carrier-supplying regions 18, or on the $n^+$ type polysilicon films 18, corresponding source electrodes 80 are disposed respectively. FIG. 11 shows cross-sectional views of adjacent two unit cells in the multi-channel structure. In the multi-channel structure, the gate electrodes 40 and the source electrodes 80 are mutually arranged in parallel so as to implement an interdigital topology. The gate electrodes 40 and source electrodes 80 can be respectively delineated in stripe geometries in a plan view. A drain electrode 90 is formed on a back surface of the $n^+$ type SiC substrate 10.

Other structure and materials are similar to the structure and materials already explained by first and second embodiments, and overlapping or redundant description may be omitted in the third embodiment. However, in addition to the technical advantage as explained in the first and second embodiments, because the electric field applied to the gate insulation film 30 is relaxed by the narrower bandgap semiconductor region 60 in the groove, the reliability of the gate insulation film 30 improves. In addition, by the topology in which the gate insulation film 30 is perpendicular to the p-n heterojunction interface, the length of the electric field lines from the gate electrodes 40 to the p-n heterojunction interface can be shortened. Therefore, the control performance of thickness of the energy barrier $\Delta Ec$ by the electric field applied from the gate electrodes 40 can be improved even further. As a result, tunneling current penetrating the barrier can be injected at lower gate voltage so that the control of the main current by the gate voltage becomes easy.

3.2 Operation of Tunnel-Injection Device of Third Embodiment:

The operation of this tunnel-injection device is basically similar to the tunnel-injection device explained in the first embodiment shown in FIG. 1. In other words, the tunnel-injection device operates under a bias condition such that the source electrodes 80 are grounded, and a positive voltage is applied to the drain electrode 90. And, under a bias condition, when the gate electrode 40 is grounded, the behavior of the tunnel-injection device becomes the reverse bias characteristic of the p-n heterojunction diode implemented by the p⁻ type lightly doped polysilicon films 60 and the SiC drift layer 20. On the other hand, when a positive voltage is applied to the gate electrode 40, the p⁻ type lightly doped polysilicon films 60 develop a strong inversion condition so that the n⁺ type layer is formed in the top surface of the p⁻ type lightly doped polysilicon films 60. Furthermore, because the electric field ascribable to the gate voltage acts on the p-n heterojunction interface between the p⁻ type lightly doped polysilicon films 60 and the SiC drift layer 20, the thickness of the energy barrier ΔEc implemented by the p-n heterojunction interface is thinned by the electric field concentration. As a result, even if the drain voltage is less than a predetermined voltage, the tunneling process occurs so that current begins to flow.

Structural difference of the third embodiment shown in FIG. 11 from the first embodiment shown in FIG. 1 lies in that the p⁻ type lightly doped polysilicon films 60 are buried at the top surface of drift layer 20. By the application of the device structure explained in the third embodiment, since the narrower bandgap semiconductor regions 60 buried at the top surface of drift layer 20 relax the electric field applied to the gate insulation film 30, the reliability of the gate insulation film 30 improves. In addition, by making the gate insulation film 30 perpendicular to the p-n heterojunction interface direction, the length of the electric field lines from the gate electrodes 40 to the p-n heterojunction interface can be shortened. Therefore, the control performance of thickness of the energy barrier ΔEc by the electric field applied from the gate electrodes 40 can be further improved. As a result, the tunneling current flowing through the barrier can be injected at lower gate voltage so that the control of the main current by the gate voltage becomes easy.

Other structure and materials are similar to the structure and materials already explained in the first embodiment, and overlapping or redundant description may be omitted in the third embodiment.

3.3 Manufacturing Method of Tunnel-Injection Device of Third Embodiment:

Next, an example of the manufacturing method for the tunnel-injection device of the third embodiment will be explained by means of sectional views of FIG. 12A to FIG. 12H.

Figure 12A:
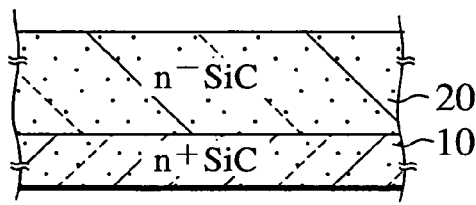
FIGS. 12A to 12H are process sectional views of the tunnel-injection device shown in FIG. 11.

(a) At first, as shown in FIG. 12A, on the n⁺ type SiC substrate 10, an n⁻ type SiC drift layer 20 having an impurity concentration of, for example, $10^{14}$–$10^{18}$ cm⁻³, and a thickness of 1–10 μm is formed.

Figure 12B:
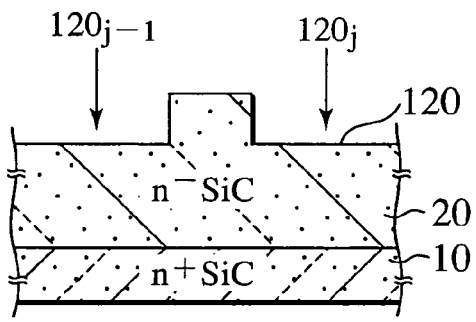

(b) As shown in FIG. 12B, a plurality of grooves 120$_{j-1}$, 120$_j$, . . . each having a depth of a 0.1–10 micrometer, for example, are dug. And, a thermal oxidation is executed so as to form a sacrificial silicon oxide film on the drift layer 20.

Figure 12C:
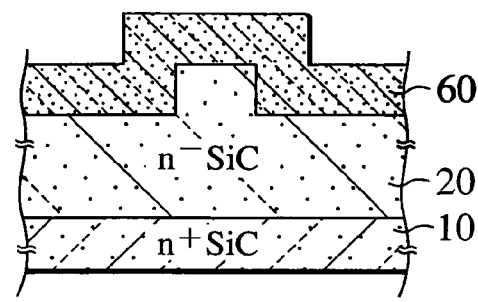

(c) After removing the sacrificial silicon oxide film, a polysilicon film having a thickness of, for example, 0.1–10 micrometer is deposited by means of RPCVD method. Then, desired impurities are doped in this polysilicon film so as to implement a p⁻ type lightly doped polysilicon films 60 as shown in FIG. 12C. On the top of the polysilicon film, a heavily doped CVD film is deposited so that, by an annealing of around 600–1000 degrees Celsius, impurities in the CVD film thermally diffused in the polysilicon film. Or, impurities may be doped directly by ion implantation. In addition, in order to improve the carrier mobility in the polysilicon film, by annealing of the polysilicon film, for example, the single crystallization can be achieved, or the grain size of polysilicon may be enlarged. Furthermore, the polysilicon film may be single crystallized by irradiation of laser light.

Figure 12D:
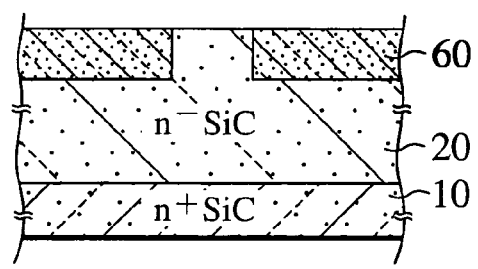

(d) Next, by the chemical mechanical polish (CMP) method, the top surface of the polysilicon film is planarized so as to leave the polysilicon films in the grooves respectively as shown in FIG. 12D.

Figure 12E:
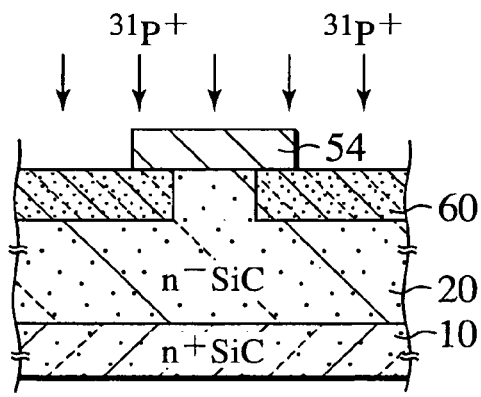

(e) Next, in predetermined regions of the p⁻ type lightly doped polysilicon films 60, phosphorous ions ($^{31}$P⁺) may be selectively implanted through the implantation mask 54 as shown in FIG. 12E.

Figure 12G:
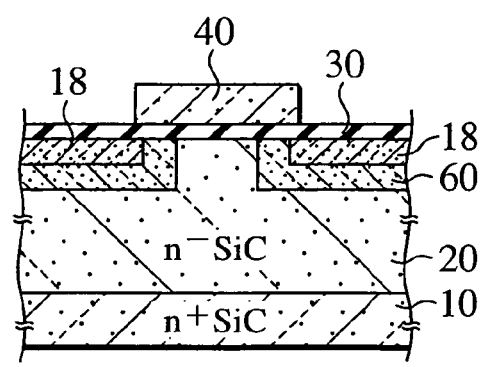
Figure 12F:
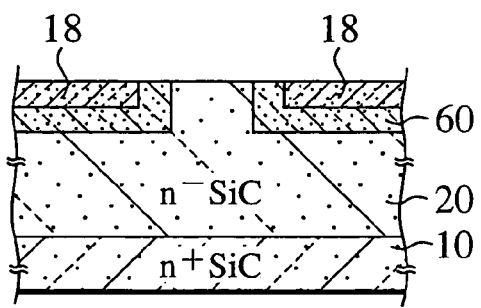

(f) Actually, after the activation-annealing, as shown in FIG. 12G, the n⁺ type polysilicon films 18 are formed in the p⁻ type lightly doped polysilicon films 60 at a predetermined depth. Then, a gate insulation film 30 is formed by CVD method. On the gate insulation film 30, a new polysilicon film having a thickness of, for example, 0.1–10 micrometer degree is deposited by means of the RPCVD method. Desired impurities are doped in the new polysilicon film afterwards. By the photolithographic delineation of the polysilicon film, the gate electrodes 40 are formed.

Figure 12H:
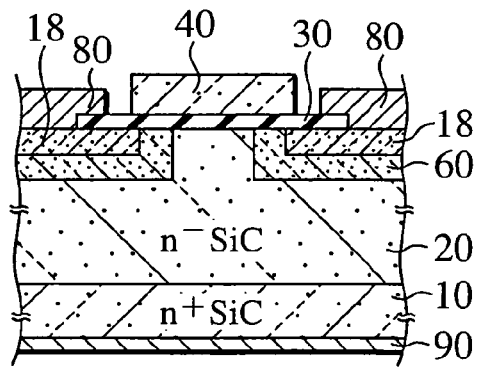

(g) As shown in FIG. 12H, a plurality of source electrodes 80 are formed so as to contact with the n⁺ type polysilicon films 18, respectively. A metallic film is deposited as a drain electrode 90 on the back surface of the SiC substrate 10. By annealing at a temperature of around 600–1300 degrees Celsius, for example, the source electrodes 80 and the drain electrode 90 become ohmic electrodes respectively. In this way the tunnel-injection device shown in FIG. 11 is completed.

Figure 13:
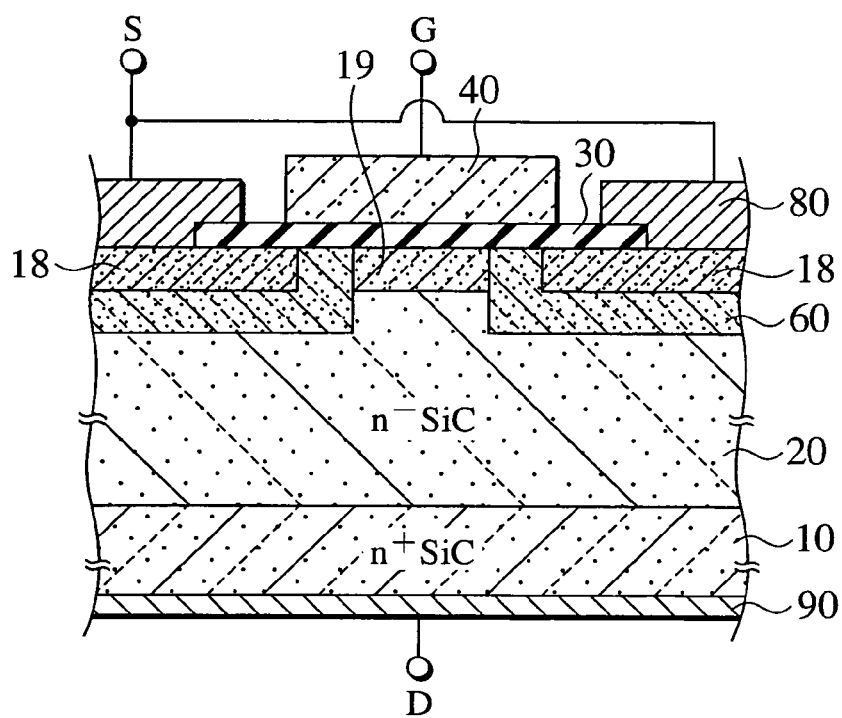
FIG. 13 is a cross sectional view of a tunnel-injection device of a modification of the third embodiment of the present invention.

3.4 Modification of Third Embodiment:

FIG. 13 shows a tunnel-injection device associated with the modification of the third embodiment. The difference from the basic configuration shown in FIG. 11 lies in a configuration such that in a part of the SiC drift layer 20 just under the gate insulation film 30, an n⁺ type heavily doped SiC region 19 is disposed.

When the n⁺ type SiC region 19 implements the p-n heterojunction with the p⁻ type polysilicon, in addition to the behavior that a large number of carriers are formed in the n⁺ type SiC region 19, because the width of the depletion layer extending in the n⁺ type SiC region 19 becomes small, the thickness of the energy barrier ΔEc is formed thinner. As a result, since tunneling current through the barrier can be injected at lower gate voltage, the control of the main current by the gate voltage becomes easy. In other words, by the tunnel-injection device of the modification of the third embodiment, in addition to the technical advantage as explained in the third embodiment, a technical advantage in which the control performance of the main current of the tunnel-injection device by the gate voltage improves is achieved. Then, although the breakdown voltage of the junction between the p-type lightly doped polysilicon films 60 and the n+ type SiC region 19 is low, the depletion layers extend into the n− type drift layer 20 from the junction interfaces between the p− type lightly doped polysilicon films 60 and the n type drift layer 20. Therefore, since the electric field across the junction between the p− type lightly doped polysilicon films 60 and the n+ type SiC region 19 is shielded, the decrease of the drain breakdown voltage can be prevented.

Other structure and materials are similar to the structure and materials already explained by the basic configuration shown in FIG. 11, and overlapping or redundant description may be omitted in the modification of the third embodiment.

Figure 14:
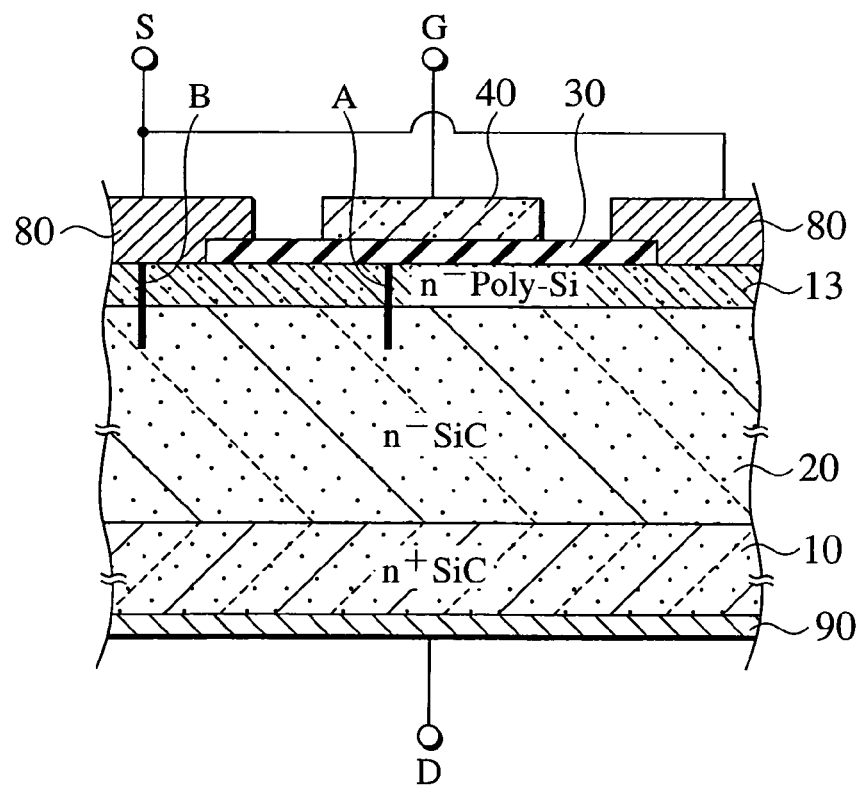
FIG. 14 is a cross sectional view showing a part of a tunnel-injection device of the fourth embodiment of the present invention.

4. Fourth Embodiment 4.1 Basic Configuration of Fourth Embodiment:

FIG. 14 shows a tunnel-injection device associated with a fourth embodiment of the present invention. FIG. 14 shows cross-sectional views of adjacent two unit cells in the multi-channel structure. In the multi-channel structure, a plurality of gate electrodes 40 and a plurality of source electrodes 80 are mutually arranged in parallel so as to implement an interdigital topology. The gate electrodes 40 and source electrodes 80 are respectively delineated in stripe geometries.

Figure 15A:
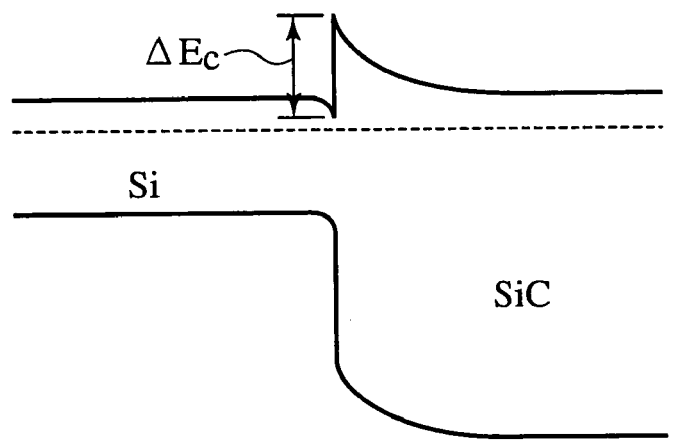
FIGS. 15A to 15C are energy band diagrams showing band-edge discontinuity barrier formed at an interface of n—n heterojunction for explaining the operation of the tunnel-injection device of the fourth to fifth embodiments of the present invention.
Figure 15B:
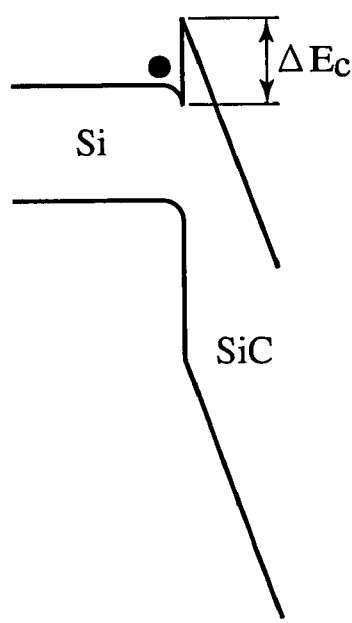
Figure 15C:
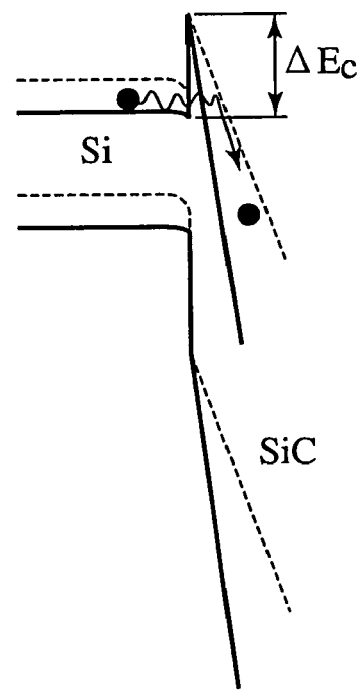

As the SiC which implements the n+ type SiC substrate 10 region, for example, 4H polytype can be used among α—SiC. The drift layer 20 on the n+ type SiC substrate 10 may be formed by epitaxial growth method. The source region 13 is made by an n-type polysilicon. Therefore, metallurgical junction between the drift layer 20 and the source region 13 implements the n—n heterojunction. The n—n heterojunction embraces SiC and polysilicon, the bandgap of SiC differs from the polysilicon. The bandgap of the source region 13 is set to be smaller than the drift layer 20. In the interface of the n—n heterojunction, there is an energy barrier ΔEc as shown in FIGS. 15A–15C.

For example, after thermally oxidizing the top surface of the source region 13 so as to form a thermal oxidation film, the thermal oxidation film is selectively etched to leave a predetermined region so as to form the gate insulation film 30. For example, the gate electrode 40 on the gate insulation film 30 is made of same materials as the source electrodes 80. The gate electrode 40 is defined by the same process stage of the source electrodes 80 through the photolithographic delineation, being separated from the source electrodes 80.

4.2 Operation of Tunnel-Injection Device of Fourth Embodiment:

Next, the operation of the tunnel-injection device is explained. In the fourth embodiment, the tunnel-injection device operates under a bias condition such that the source electrodes 80 are grounded, and a positive potential is applied to the drain electrode 90. When the gate electrode 40 is applied with the ground potential, the current blocking state is maintained, because in the n-n heterojunction interface between the source region 13 and the drift layer 20, an energy barrier ΔEc against the conduction electrons is formed.

By means of energy band diagram shown in FIG. 15A to FIG. 15C, the behavior of the n—n heterojunction between n− type SiC serving as the drift layer 20 and n− type polysilicon serving as the source region 13 will be explained in detail. In each energy band diagram of FIG. 15A to FIG. 15C, the energy band of the n− type silicon corresponding to the source region 13 is shown in the left, and the energy band diagram of the n− type SiC corresponding to the drift layer 20 is shown in the right side. Although in the tunnel-injection device structure described above, the source region 13 was explained as made of polysilicon, in FIG. 15A to FIG. 15C, the energy band diagram of silicon is employed. In this explanation, in order that the behavior of the n—n heterojunction can be easily understood, it illustrates an ideal energy band diagram, in which there is no interface state in the n—n heterojunction interface.

In the junction interface between silicon and SiC, there is an energy barrier ΔEc ascribable to the difference of electron affinity of both silicon and SiC.

Regarding the tunnel-injection device related to the fourth embodiment shown in FIG. 14, the energy band diagram of the junction interface between the source region 13 just under the gate electrode 40 and the drift layer 20 is illustrated in FIG. 15A to FIG. 15C. The energy band diagram is taken on line A in FIG. 14. FIG. 15A is the energy band diagram in so-called thermal equilibrium state, in which none of the gate electrode 40, the source electrodes 80 and the drain electrode 90 are biased. FIG. 15B corresponds to a bias condition in which the gate electrode 40 and the source electrodes 80 are both grounded, but a predetermined positive potential is applied to the drain electrode 90. As shown in FIG. 15B, a depletion layer broadens in the drift layer 20 of the n—n heterojunction interface, depending on the applied drain-potential. Because conduction electrons in the source region 13 cannot surmount the energy barrier ΔEc, conduction electrons accumulate in the junction interface. Therefore, electric field lines establishing the depletion layer extending in the SiC side terminate in the junction interface. The drain electric field is shielded in the source region 13. Then, even if the polysilicon implementing the source region 13 has very thin geometry, or the thickness is around 20 nm, for example, it is possible to maintain the current blocking state so as to establish a predetermined breakdown voltage.

Next, so as to transit from the current blocking state to conducting state, as positive potential is applied to the gate electrode 40, under the condition that the polysilicon film serving as the source region 13 is made thin, the gate electric field extends through the gate insulation film 30 to the n—n heterojunction interface between the source region 13 and the drift layer 20, and an accumulation layer of the conduction electrons is formed in the source region 13 and the drift layer 20. In other words, the energy band diagram in the junction interface between the source region 13 just under the gate electrode 40 and the drift layer 20, varies as shown by the solid line in FIG. 15C, which is taken on line A in FIG. 14. Because the energy band varies along the solid line, in comparison with the energy band diagram in the junction interface between the source region 13 just under the gate electrode 40 and the drift layer 20, which show the off-sate by the broken line taken on line A in FIG. 14, the potential of the source region 13 is depressed so that the slope of the triangular energy barrier ΔEc of the drift layer 20 become steep, conduction electrons can tunnel through the whole energy barrier ΔEc. In addition, the energy band diagram in the junction interface between the source region 13 right under the source electrodes 80 and the drift layer 20, which is taken on line B in FIG. 14, keeps the diagram represented by the broken line in FIG. 15C, and conduction electrons are supplied from the source region 13 just under the source electrodes 80 to the source region 13 just under the gate electrode 40. Then, conduction electrons, which were blocked by the energy barrier ΔEc, can be injected from the source electrodes 80 through the source region 13 to the drift layer 20 so as to implement the conducting state.

When the gate electrode 40 is ground again so that the conducting state can turn into the current blocking state, the accumulation-state of the conduction electrons formed in the n—n heterojunction interface between the source region 13 and the drift layer 20 is removed, and the tunneling through the energy barrier $\Delta Ec$ stops. In addition, the flow of conduction electrons from the source region 13 to the drift layer 20 stops. Furthermore, when conduction electrons, which were in the drift layer 20, are transported to the SiC substrate 10, and swept out, the depletion layer broadens in the drift layer 20 from the n—n heterojunction so as to establish the current blocking state.

In addition, in the fourth embodiment, the same as in the structure of earlier MOSFETs, for example, the source electrodes 80 are grounded, and reverse conduction, or "the free-wheeling operation", in which a negative potential is applied to the drain electrode 90 is possible. For example, under a bias condition in which the source electrodes 80 and the gate electrode 40 is grounded, and when a positive potential equivalent to the diffusion-potential caused between silicon and SiC is applied to the drain electrode 90, the energy barrier $\Delta Ec$ blocking conduction electrons extinct, and conduction electrons are injected from the source region 13 into the drift layer 20 so as to implement the reverse conducting state. Furthermore, when the gate electrode 40 is not grounded so as to be employed as a control electrode, the same as in the structure of earlier MOSFETs, by applying a potential of less than or equal to the diffusion-potential caused between silicon and SiC to the drain electrode 90, the reverse conduction is established.

In light of above discussions, the tunnel-injection device according to the fourth embodiment can achieve the reverse conduction function, which is achieved in the structure of earlier MOSFETs. As stated above, the tunnel-injection device related to the fourth embodiment as shown in FIG. 14 can realize the similar operation as the earlier MOSFETs.

Furthermore, the tunnel-injection device related to the fourth embodiment can achieve following technical advantages:

(a) Although the operation is substantially same as the voltage drive type SiC devices, as the doping level control of the drift layer 20 is not required in the fabrication-process of the tunnel-injection device, the fabrication-process becomes simple.

(b) In order to establish precisely the doping level control of the drift layer 20 in the earlier MOSFET structure, the high temperature anneal of around 1700 degrees Celsius in order to activate the implanted ions was necessary. In contrast, in the fourth embodiment, because the doping level control is not required as mentioned above, the problem of the poor surface morphology ascribable to the high temperature anneal can be avoided, and the improvement of on-state resistance can be expected.

(c) When a positive potential was applied to the gate electrode 40 so as to turn the tunnel-injection device into a conducting state, conduction electrons flow through whole heterojunction interface between the source region 13 just under the gate electrode 40 and the drift layer 20. Furthermore, because the length of the channel of tunnel-injection device, in which conducting/non-conducting states are controlled, can be decreased to the minimum thickness of the source region 13, according which the current blocking state by the n—n heterojunction can be maintained, or the blocking voltage can be established, the channel resistance, or the on-state resistance can be reduced.

(d) In the earlier MOSFET structure, as the gate insulation film 30 directly contacts with the drift layer 20, the gate insulation film 30 has been affected by the drain electric field. On the contrary, in the tunnel-injection device of the fourth embodiment, because the source region 13 made of polysilicon is inserted between the gate insulation film 30 and the drift layer 20, most of the drain electric fields do not affect the gate insulation film 30. Therefore, the dielectric breakdown of the gate insulation film 30 does not occur easily, and the maximum operating voltage of the tunnel-injection device can be largely improved.

(e) In the tunnel-injection device of the fourth embodiment, by controlling the impurity concentration of the drift layer 20 and the source region 13, respectively, the height of the energy barrier $\Delta Ec$ can be changed so as to easily realize a desired breakdown voltage.

Figure 16:
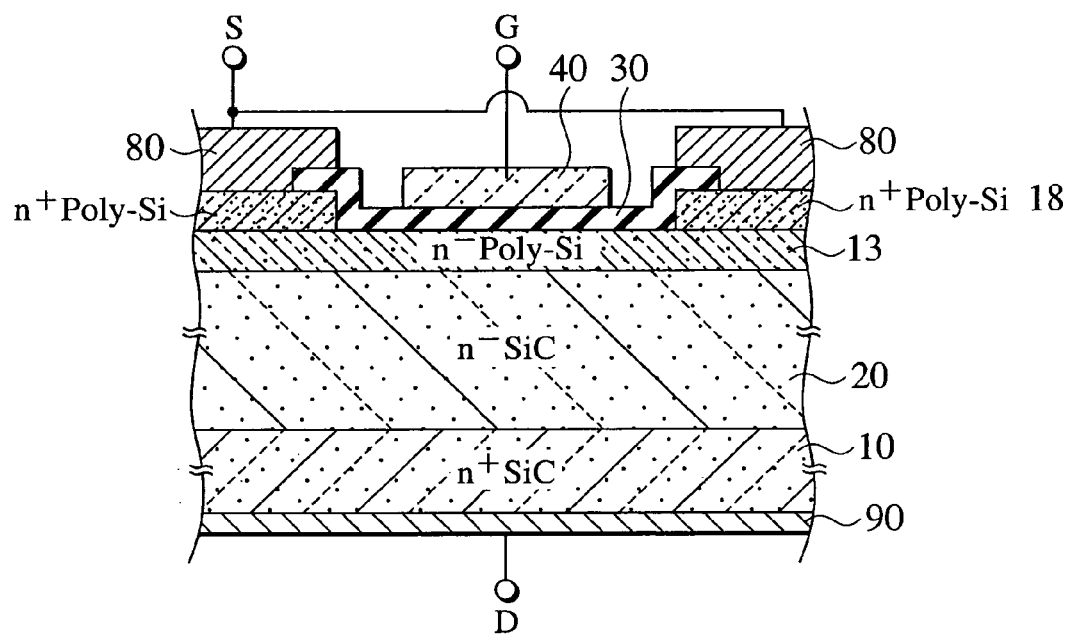
FIG. 16 is a cross sectional view of a tunnel-injection device of a first modification of the fourth embodiment of the present invention.

4.3 First Modification of Fourth Embodiment:

In the configuration of a device related to the first modification of the fourth embodiment, $n^+$ type source contact regions 18 made of a polysilicon, for example, are inserted between the source region 13 and the source electrodes 80 as shown in FIG. 16. Each of the source contact regions 18, the same as in the structure of the earlier MOSFET, are disposed so that the source region 13 and the source electrodes 80 can implement ohmic contact. On the source region 13 made of $n^-$ type polysilicon, the source contact regions 18 made of $n^+$ type polysilicon are laminated. The other configuration of the tunnel-injection device related to the first modification of the fourth embodiment is similar to the basic configuration of the tunnel-injection device of the fourth embodiment shown in FIG. 14.

According to the tunnel-injection device of the first modification of the fourth embodiment, by inserting the source contact regions 18 made of the $n^+$ type polysilicon, ohmic contact can be facilitated between the source electrodes 80 and the source region 13 so as to reduce the contact resistance between the source electrodes 80 and the source region 13. Operation, function and effectiveness of the tunnel-injection device of the first modification of the fourth embodiment are respectively similar to the tunnel-injection device of the basic configuration shown in FIG. 14. In the first modification of the fourth embodiment, although the source contact regions 18 were laminated on the source region 13, the source contact regions 18 can be buried in the source region 13.

Figure 17:
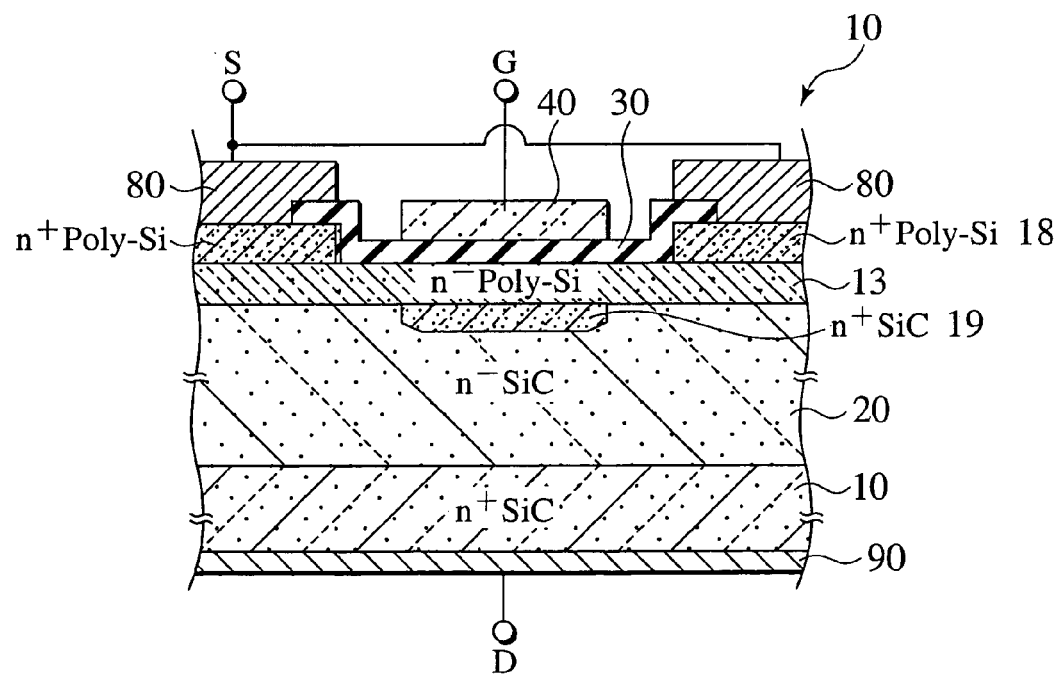
FIG. 17 is a cross sectional view of a tunnel-injection device of a second modification of the fourth embodiment of the present invention.

4.4 Second Modification of Fourth Embodiment:

A device related to the second modification of the fourth embodiment encompasses, as shown in FIG. 17, at the interface of the n-n heterojunction between the drift layer 20 and the source region 13, just under the gate electrode 40, an $n^+$ type low resistivity region 19 made of SiC, having an impurity concentration higher than the drift layer 20. The other configuration of the tunnel-injection device of the second modification of the fourth embodiment is similar to the basic configuration shown in FIG. 14 and the first modification shown in FIG. 16.

In the tunnel-injection device of the second modification of the fourth embodiment, because at the n—n heterojunction interface between the source region 13 just under the gate electrode 40 and the drift layer 20, the $n^+$ type SiC region 19 is inserted, the energy barrier $\Delta Ec$ is made small. Therefore, as explained in the basic configuration of the fourth embodiment, when a positive potential is applied to the gate electrode 40, conduction electrons flowing from the source region 13 become easily able to tunnel through energy barrier $\Delta Ec$ of the n—n heterojunction. In other words, in the tunnel-injection device of the second modification of the fourth embodiment, in addition to the technical advantages achieved by the basic configuration of the fourth embodiment and the first modification of the fourth embodiment described above, the on-state resistance can be improved even further.

Figure 18:
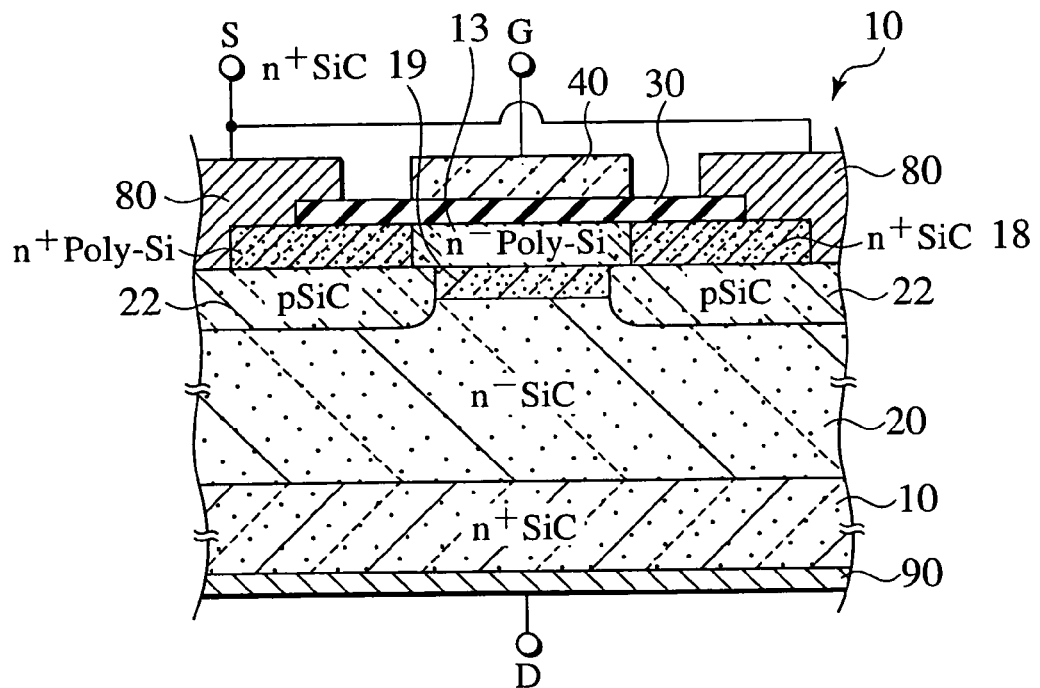
FIG. 18 is a cross sectional view of a tunnel-injection device of a third modification of the fourth embodiment of the present invention.

4.5 Third Modification of Fourth Embodiment:

FIG. 18 shows a configuration of a device related to a third modification of the fourth embodiment. In the tunnel-injection device of the third modification of the fourth embodiment, similar to the second modification of the fourth embodiment shown in FIG. 17, at the n—n heterojunction interface between the source region 13 just under the gate electrode 40 and the drift layer 20, an $n^+$ type low resistivity region 19 made of SiC is formed. The impurity concentration of the $n^+$ type SiC region 19 is higher than that of the drift layer 20. And, in the tunnel-injection device of the third modification of the fourth embodiment, next to the lightly doped source region 13 just under the gate electrode 40, $n^+$ type source contact regions 18 are embedded. That is, in the tunnel-injection device of the third modification of the fourth embodiment, the lightly doped source region 13 and the heavily doped source contact regions 18 are made of the same polysilicon film. And, as shown in FIG. 18, in the drift layer 20, from top surface side of the drift layer 20, buffering regions 22 made of p type SiC are buried at a predetermined depth so as to sandwich the low resistivity region 19 from both sides.

In other words, the buffering regions 22 are implemented by selective doping of p type impurities, introduced from the top surface side of the drift layer 20. The potential of the buffering regions 22 is, for example, fixed to the potential of the source electrodes 80. In the tunnel-injection device of the third modification of the fourth embodiment, similar to the basic configuration, the first modification and the second modification of the fourth embodiments described above, by the bias condition in which the source electrodes 80 and the gate electrode 40 are grounded, and a positive potential was applied to the drain electrode 90, the current blocking state is established. Namely, in the tunnel-injection device of the third modification of the fourth embodiment, because a reverse bias is applied to the p-n junction between the buffering regions 22, whose potential is fixed to the source electrodes 80, the depletion layers extend from the junction interfaces into the drift layer 20. When the distance between the couple of the buffering regions 22, facing so as to sandwich the low resistivity region 19, is small, the drift layer 20 to which the low resistivity region 19 contacts can be depleted by the depletion layers extending respectively from the buffering regions 22. Therefore, by increasing the impurity concentration of the low resistivity region 19 further more so that the low resistivity region 19 is not completely depleted, the maximum operating voltage of the tunnel-injection device can be maintained by the buffering regions 22.

In other words, the tunnel-injection device explained in the third modification of the fourth embodiment, in addition to the technical advantages explained respectively in the basic configuration, the first modification and the second modification of the fourth embodiments, because the impurity concentration of the low resistivity region 19 can be increased to extremely high levels, can improve the on-state resistance.

Figure 19:
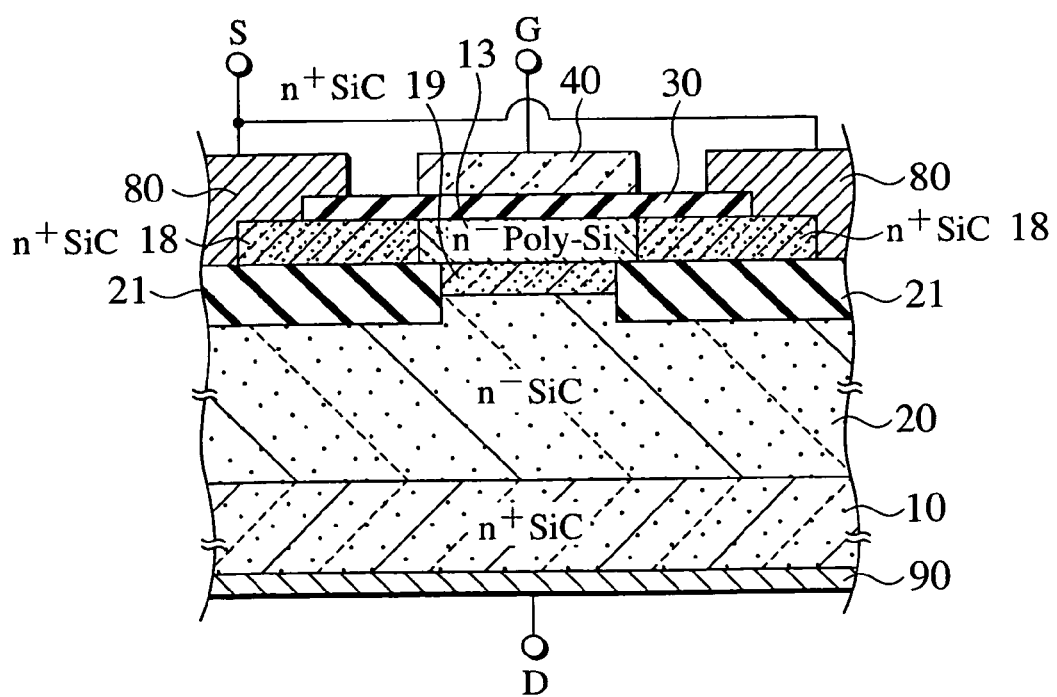
FIG. 19 is a cross sectional view of a tunnel-injection device of a fourth modification of the fourth embodiment of the present invention.

4.6 Fourth Modification of Fourth Embodiment:

In a configuration of a device of the fourth modification of the fourth embodiment, as shown in FIG. 19, instead of the buffering regions 22 of the third modification of the fourth embodiment described above, dielectric regions 21 are buried. These dielectric regions 21 contact with the lower parts of both edges of the lightly doped source region 13 and with the heavily doped source contact regions 18. The configuration having the dielectric regions 21 can achieve technical advantage such that the fabrication-process of the dielectric regions 21 is easy to compare with the formation of the buffering regions 22 of the third modification of the fourth embodiment, described above, but the same technical advantage as the configuration having the buffering regions 22 can be achieved.

Therefore, by the tunnel-injection device of the fourth modification of the fourth embodiment, in addition to the technical advantages explained respectively in the basic configuration, the first modification, the second modification and the third modification of the fourth embodiments, the fabrication-process can be simplified further.

Figure 20:
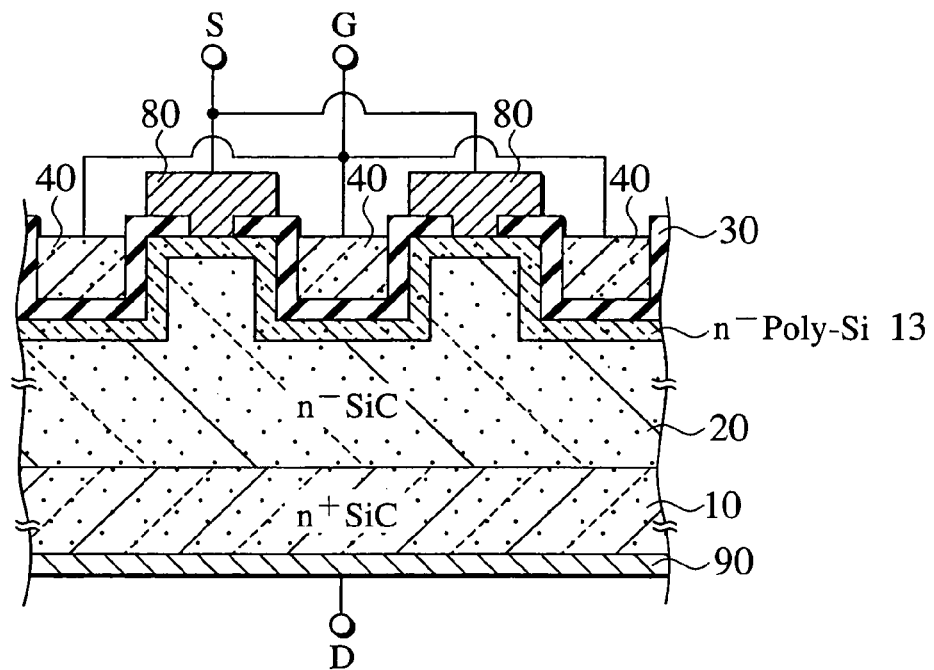
FIG. 20 is a cross sectional view showing a part of a tunnel-injection device of the fifth embodiment of the present invention.

5. Fifth Embodiment 5.1 Basic Configuration of Fifth Embodiment:

FIG. 20 shows a part of the cross-sectional view of a tunnel-injection device related to a fifth embodiment. The cross-sectional view corresponds to two unit cells in the multi-channel configuration. In the tunnel-injection device of the fifth embodiment, similar to the fourth embodiment described above, various polytypes of SiC can be employed. On the $n^+$ type SiC substrate 10 of 4H polytype, for example, an $n^-$ type drift layer 20 is disposed. In the top surface of the drift layer 20, a plurality of grooves are formed in-parallel. A lightly doped source region 13 made of n– type polysilicon covers the top surface of the drift layer 20, including these grooves, for example, along the recessed geometry of the top surface of the drift layer 20.

In the tunnel-injection device of the fifth embodiment, the junction between the drift layer 20 and the lightly doped source region 13 implements the n—n heterojunction. In the n—n heterojunction, the SiC contacts with polysilicon, which has different bandgap from the SiC, and therefore an energy barrier $\Delta Ec$ is generated at the junction interface. In the inside of grooves formed at the top surface of the drift layer 20, gate insulation films 30, each made of silicon oxide film, are laminated respectively, and on the gate insulation films 30 a plurality of gate electrodes 40 are formed so as to bury the grooves. On the lightly doped source region 13, source electrodes 80 are disposed. A drain electrode 90 is formed on the bottom surface of the $n^+$ type SiC substrate 10.

5.2 Operation of Tunnel-Injection Device of Fifth Embodiment:

The operation of the tunnel-injection device of the fifth embodiment is similar to the tunnel-injection device of the fourth embodiment. For example, the tunnel-injection device operates under a bias condition such that the source electrodes 80 are grounded and a positive potential is applied to the drain electrode 90. In the tunnel-injection device, when the gate electrodes 40 are grounded, the current blocking state is established. The reason why the tunnel-injection device can establish such a current blocking state is because an energy barrier $\Delta Ec$ blocking the flow of conduction electrons is formed in the n—n heterojunction interface between the lightly doped source region 13 and the drift layer 20.

For the transition to the conducting state from the current blocking state, a positive potential is applied to the gate electrode 40 through the gate insulation film 30, and because the gate electric field extends to the n—n heterojunction interface between the lightly doped source region 13 and the drift layer 20, an accumulation layer of conduction electrons is formed at the interface. Then, the potential is depressed both at the lightly doped source region 13 just under the gate electrode 40 and the drift layer 20 in the junction interface.

Therefore, the slope of the triangular energy barrier ΔEc of the n—n heterojunction interface becomes steep by the accumulation effect of the conduction electrons so that conduction electrons can-penetrate through the energy barrier ΔEc by tunneling. From this reason, the blocked flow of electrons by the energy barrier ΔEc can now spread into the drift layer 20 so as to establish the conducting state.

In the fifth embodiment, grooves are formed at the top surface of the drift layer 20, because the area of the lightly doped source region 13 contacting with the gate electrodes 40 can be increased furthermore, the width of the path through which conduction electrons flow is made broader, and the resistance can be reduced further.

Next, for the transition from the conducting state to the current blocking state, when the gate electrodes 40 are grounded, the accumulation-state of the conduction electrons accumulated in the n—n heterojunction interface between the lightly doped source region 13 and the drift layer 20 is removed, the tunneling in the energy barrier ΔEc stops. And, the flow of the conduction electrons from the lightly doped source region 13 to the drift layer 20 stops. Furthermore, as the conduction electrons in the drift layer 20 are swept away to the n$^+$ type SiC substrate 10, the depletion layer starts to broaden in the drift layer 20 from the n—n heterojunction interface so as to establish the current blocking state.

In the fifth embodiment, similar to the fourth embodiment, by a bias condition such that, for example, the source electrodes 80 are grounded and a negative potential is applied to the drain electrode 90, the reverse conduction, or the free-wheeling operation can be facilitated. As thus described, in the fifth embodiment, in addition to the features explained in the fourth embodiment, due to the grooves formed at the top surface of the drift layer 20, the area of the lightly doped source region 13 contacting with the gate electrodes 40, which serves as the path for conduction electrons in the conducting state, can be made large so that a technical advantage of reducing the on-state resistance is achieved.

Figure 21:
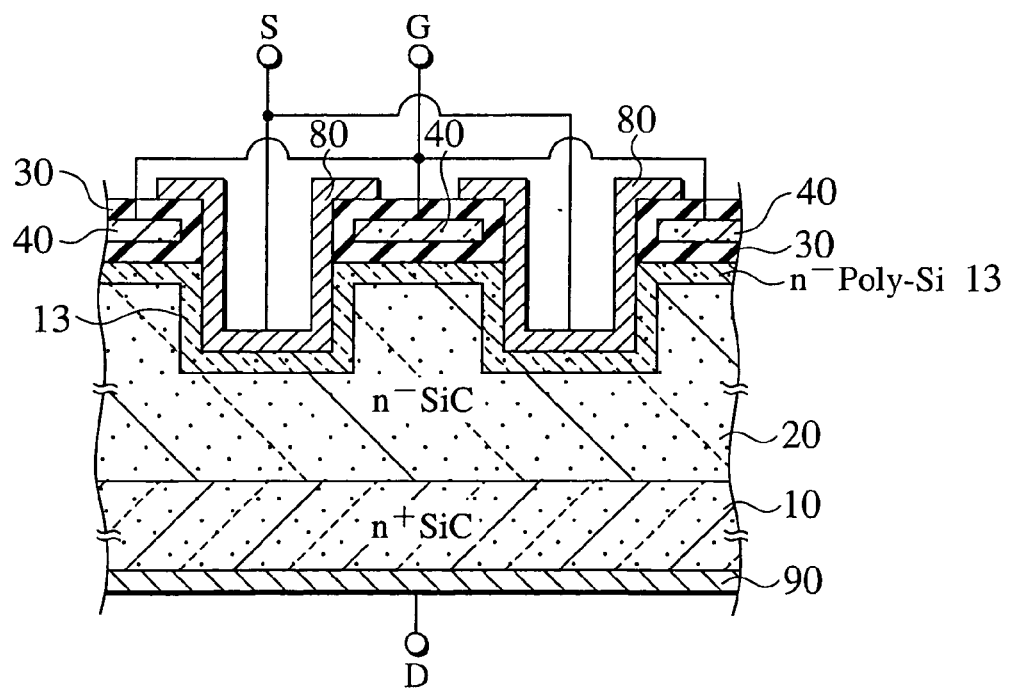
FIG. 21 is a cross sectional view of a tunnel-injection device of a first modification of the fifth embodiment of the present invention.

5.3 First Modification of Fifth Embodiment:

FIG. 21 shows a tunnel-injection device related to a first modification of the fifth embodiment. FIG. 16 is a cross-sectional view showing two neighboring unit cells. Various polytypes of SiC can be employed, but 4H polytype, for example is employed in the first modification of the fifth embodiment. On the n$^+$ SiC substrate 10, an n$^-$ type drift layer 20 is formed. In the first modification of the fifth embodiment, similar to the basic configuration of the fifth embodiment described in FIG. 20, a plurality of grooves are formed at the top surface of the drift layer 20. Covering the top surface side of the drift layer 20 including these grooves, a lightly doped source region 13 made of an n$^-$type polysilicon, for example, is formed along the recessed geometry of the top surface of the drift layer 20. That is, the junction between the drift layer 20 and the lightly doped source region 13 implements the n—n heterojunction. The n—n heterojunction encompasses SiC and polysilicon, whose bandgap is different from the SiC, so as to generate an energy barrier ΔEc in the junction interface.

On a lightly doped source region 13 formed on the top surface of the drift layer 20, a plurality of gate insulation films 30 made of silicon oxide film are disposed, and a plurality of gate electrodes 40 are selectively disposed on the gate insulation films 30 above the tops of the protruding portions of the drift layer 20. In addition, a plurality of source electrodes 80 are disposed on the lightly doped source region 13 so as to cover the bottoms and sidewalls of the respective grooves. In the bottom surface of the n$^+$ SiC substrate 10, a drain electrode 90 is formed.

The operation of the tunnel-injection device related to the first modification of the fifth embodiment is similar to the basic configuration shown in FIG. 20. For example, the tunnel-injection device operates under a bias condition such that the source electrodes 80 are grounded, and a positive potential is applied to the drain electrode 90. When the gate electrodes 40 was grounded, the current blocking state is achieved, because an energy barrier ΔEc blocking the flow of conduction electrons is formed in the n—n heterojunction interface between the lightly doped source region 13 and the drift layer 20.

In the first modification of the fifth embodiment, because grooves are formed at the top surface of the drift layer 20 so that the gate insulation films 30 can be disposed on the protruding potion sandwiched by the groove and so that the gate electrodes 40 are formed on the gate insulation films 30, the effective lightly doped source region 13 lies at a deeper level than the level where the energy barrier ΔEc is formed at the n—n heterojunction interface between the lightly doped source region 13 and the drift layer 20. The lightly doped source region 13 is fixed to the ground potential. Because of this configuration, it becomes easier to maintain the blocking performance of the tunnel-injection device. That is, in the tunnel-injection device configuration according to the first modification of the fifth embodiment, because the reverse bias can be applied to the heterojunction between the lightly doped source region 13 disposed at the bottom of grooves and the drift layer 20, depletion layers extends deeply from the junction interfaces at the bottom of grooves.

When the space between neighboring grooves is made short, by the depletion layer extended from the lightly doped source region 13 disposed deep in the bottom of the grooves, the drift layer 20 just under the gate electrodes 40 can be easily depleted. In other words, the tunnel-injection device according to the first modification of the fifth embodiment can improve the blocking performance in the non-conducting state sufficiently. As a positive potential is applied to the gate electrodes 40 so that the tunnel-injection device turns into the conducting state from the current blocking state, through the gate insulation film 30, the gate electric field extends to the n—n heterojunction interface between the lightly doped source region 13 and the drift layer 20, the accumulation layer of the conduction electrons is formed at the interface. In other words, both the potential of the lightly doped source region 13 just under the gate electrodes 40 and the potential of the drift layer 20 in the junction interface are depressed by the gate potential. Then, because the slope of the triangular energy barrier ΔEc in the n—n heterojunction interface becomes steep by the accumulation effect of the conduction electrons, it become possible for the conduction electrons to tunnel through the energy barrier ΔEc. Therefore, the electrons, which were blocked by the energy barrier ΔEc, are injected into the drift layer 20 so as to establish the conducting state.

When a gate electrodes 40 are grounded again so that the tunnel-injection device turns from the conducting state into the current blocking state, the accumulation-state of the conduction electrons is removed in the n—n heterojunction interface between the lightly doped source region 13 and the drift layer 20, so as to stop the tunneling through the energy barrier ΔEc. And, after the flow of conduction electrons from the lightly doped source region 13 to the drift layer 20 has stopped and the conduction electrons in the drift layer 20 are swept away to the n⁺ SiC substrate 10 so as to deplete the drift layer 20, the depletion layer broadens in the drift layer 20 from the n—n heterojunction interface to establish the current blocking state. In addition, in the first modification of the fifth embodiment, similar to the fourth embodiment, the tunnel-injection device can operate in the reverse conduction mode so as to achieve the free-wheeling operation, under a bias condition such that, for example, the source electrodes 80 are grounded, and a negative potential is applied to the drain electrode 90.

Figure 22:
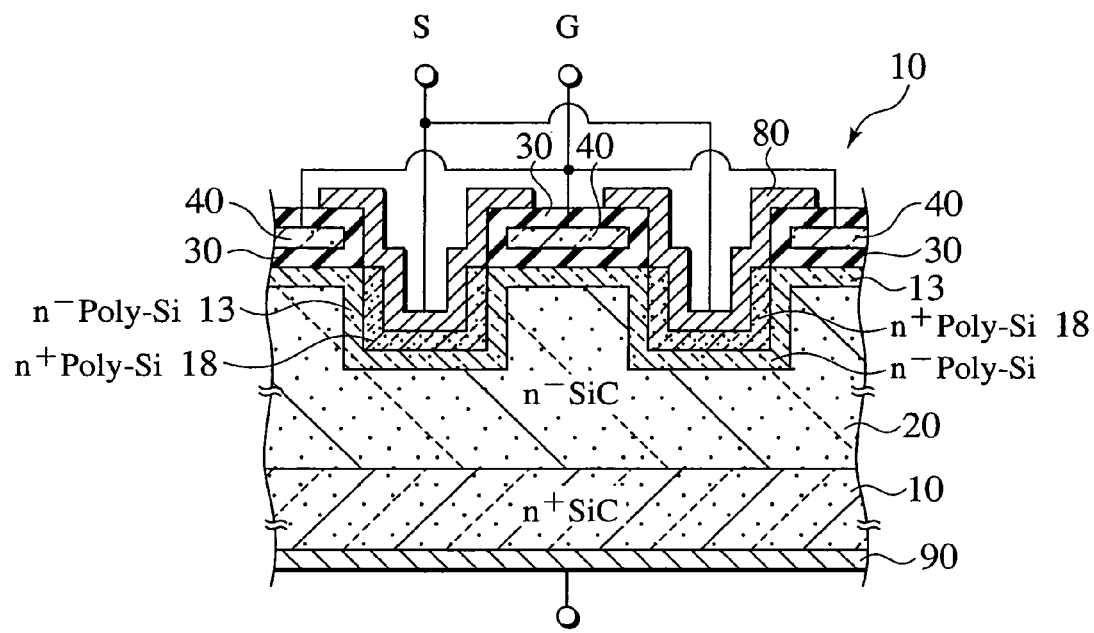
FIG. 22 is a cross sectional view of a tunnel-injection device of a second modification of the fifth embodiment of the present invention.

5.4 Second Modification of Fifth Embodiment:

FIG. 22 shows a tunnel-injection device related to a second modification of the fifth embodiment. The device related to the second modification of the fifth embodiment, in the tunnel-injection device configuration of the first modification shown in FIG. 21, n⁺ type source contact regions 18 made of polysilicon are inserted between the lightly doped source region 13 and the source electrodes 80, so that each of the lightly doped source region 13 and the source electrodes 80 can implement ohmic contact. Other configurations in the second modification of the fifth embodiment are similar to the configuration of the first modification of the fifth embodiment described above.

In the second modification of the fifth embodiment, an example in which the heavily doped source contact regions 18 is disposed on the lightly doped source region 13 is shown, but the heavily doped source contact regions 18 can be embedded in the inside of the lightly doped source region 13, contacting with the source electrodes 80.

Anyway, the lightly doped source region 13 made of the n⁻ type polysilicon and the source electrodes 80 can implement ohmic contact, the contact resistance associated with the source electrodes 80 can be reduced.

Figure 23:
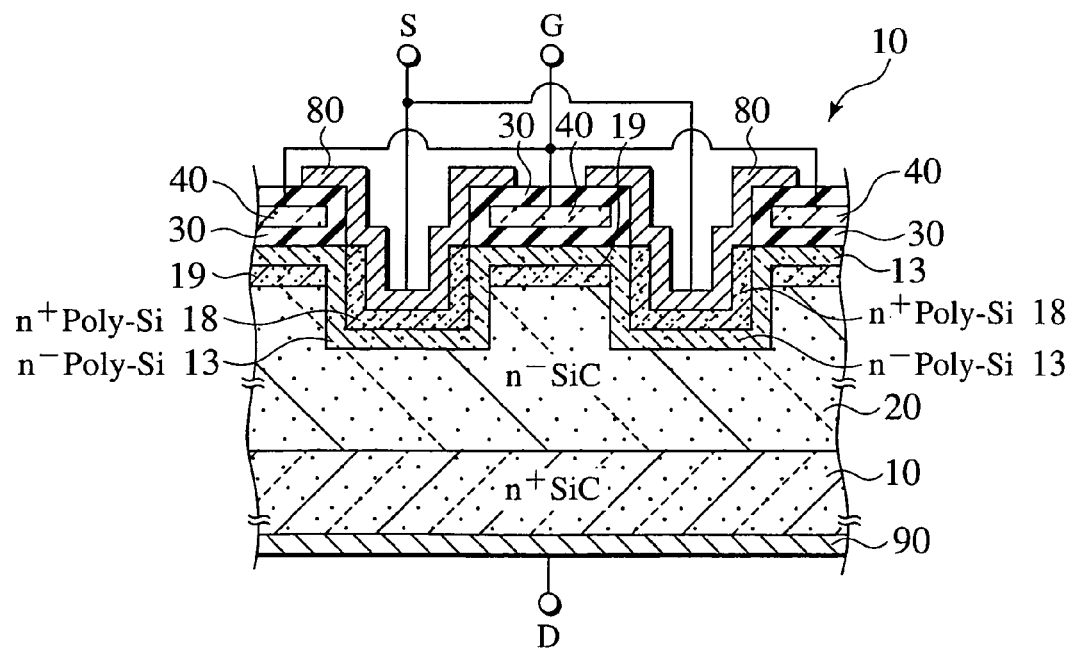
FIG. 23 is a cross sectional view of a tunnel-injection device of a third modification of the fifth embodiment of the present invention.

5.5 Third Modification of Fifth Embodiment:

FIG. 23 shows a tunnel-injection device related to a third modification of the fifth embodiment. In the n—n heterojunction interface between the drift layer 20 and the lightly doped source region 13 just under the gate electrodes 40, an n⁺ type low resistivity region 19 made of the SiC having an impurity concentration higher than the drift layer 20 is disposed. Other configurations are similar to the tunnel-injection device shown in FIG. 22.

The heterojunction interface between the lightly doped source region 13 just under the gate electrodes 40 and the drift layer 20 is implemented by an n⁻ type polysilicon and an n⁺ type SiC so that the energy barrier ΔEc can be made small.

By applying a positive potential, the same as that explained in the fourth embodiment for the conducting state, to the gate electrodes 40, conduction electrons flowing from the lightly doped source region 13 become able to easily tunnel through the energy barrier ΔEc in the n—n heterojunction interface.

By the tunnel-injection device explained in the third modification of the fifth embodiment, in addition to the technical advantages explained respectively in the basic configuration, the first modification and the second modification of the fifth embodiments, the on-state resistance can be improved even further.

Figure 24:
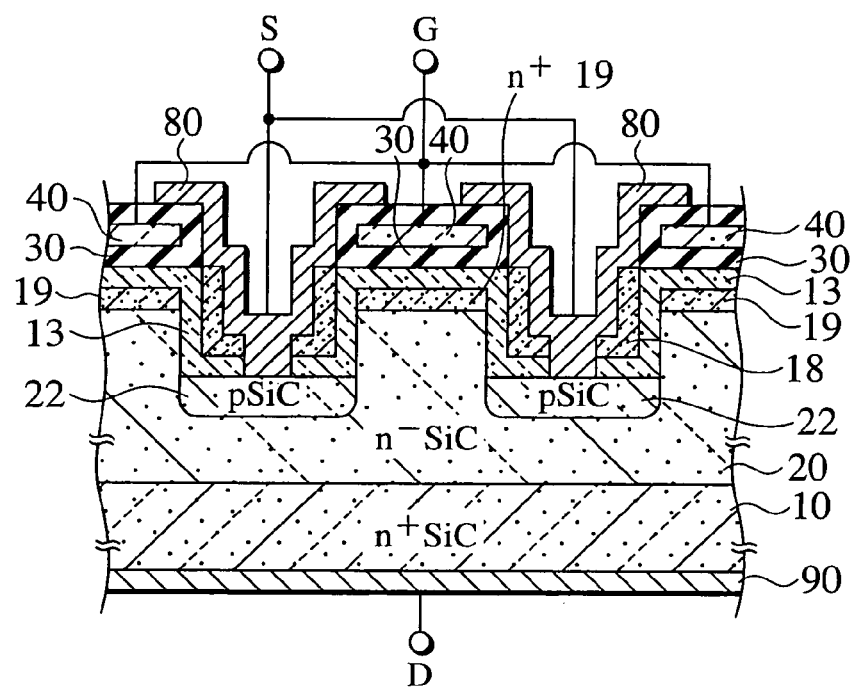
FIG. 24 is a cross sectional view of a tunnel-injection device of a fourth modification of the fifth embodiment of the present invention.

5.6 Fourth Modification of Fifth Embodiment:

FIG. 24 shows a tunnel-injection device related to a fourth modification of the fifth embodiment. A device related to the fourth modification of the fifth embodiment corresponds to a modification of the tunnel-injection device explained in the third modification of the fifth embodiment. That is, in the tunnel-injection device shown in FIG. 23, p type buffering regions 22 are further disposed so as to contact with the lightly doped source region 13 or the heavily doped source contact regions 18 at bottoms of the grooves.

The buffering regions 22 are, for example, fixed to the potential of the source electrodes 80. Other configurations in the fourth modification of the fifth embodiment are similar to the third modification of the fifth embodiment described above.

In the fourth modification of the fifth embodiment, similar to the operations explained in the basic configuration, the first modification, the second modification and the third modification of the fifth embodiments, under a bias condition such that the source electrodes 80 and the gate electrodes 40 are grounded, and a positive potential is applied to the drain electrode 90, it becomes easier to realize the current blocking state. In the fourth modification of the fifth embodiment, as the reverse bias is applied across the p-n junction between the buffering regions 22, whose potential is fixed to the source electrodes 80, depletion layers extends in the drift layer 20 from the junction interface of the p-n junction. And when the spacing between grooves is short, by the facing depletion layers extended from the buffering regions 22, the drift layer 20 sandwiched by the grooves can easily be depleted. By increasing the impurity concentration of the low resistivity region 19 further so as not to allow the complete depletion of the low resistivity region 19, the maximum operating voltage of the tunnel-injection device can be maintained by the effect of the buffering regions 22.

In the fourth modification of the fifth embodiment, in addition to the technical advantages achieved by the basic configuration, the first modification, the second modification and the third modification of the fifth embodiment described above, because the impurity concentration of the low resistivity region 19 can be increased more, the on-state resistance can be improved.

Figure 25:
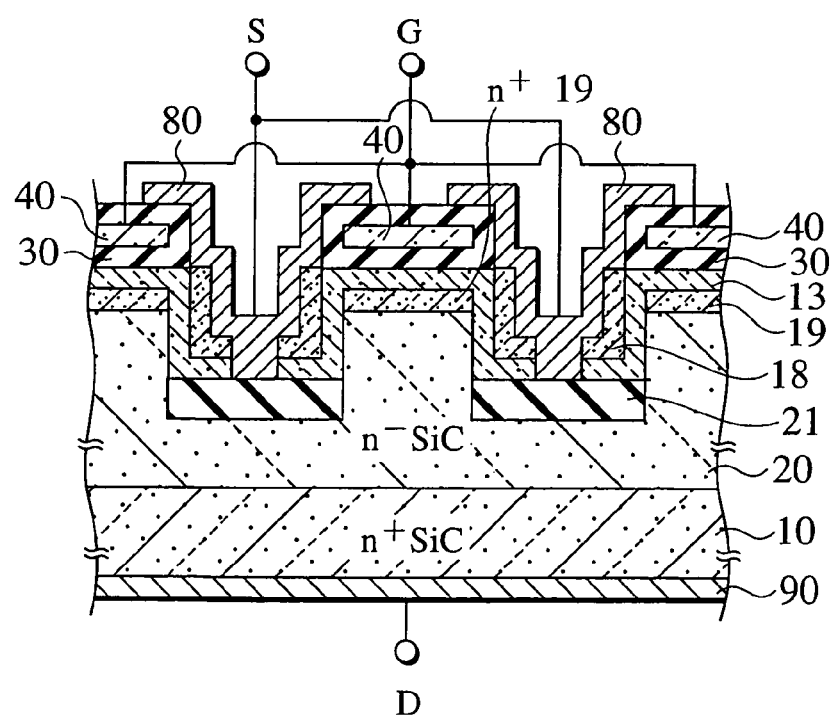
FIG. 25 is a cross sectional view of a tunnel-injection device of a fifth modification of the fifth embodiment of the present invention.

5.7 Fifth Modification of Fifth Embodiment:

FIG. 25 shows a tunnel-injection device related to a fifth modification of the fifth embodiment. The device of the fifth modification of the fifth embodiment, in the tunnel-injection device shown in FIG. 24, exchanges the buffering regions 22 for dielectric regions 21. As shown in FIG. 25, dielectric regions 21 contacting with the lightly doped source region 13 or the heavily doped source contact regions 18 are formed at the bottoms of each groove, so that the dielectric regions 21 can be connected to the source electrodes 80. Other configurations in the fifth modification of the fifth embodiment are similar to the fourth modification of the fifth embodiment shown in FIG. 24.

By the fifth modification of the fifth embodiment, a technical advantage such that the fabrication-process of the dielectric region is easier than the fabrication-process of the buffering regions 22 can be achieved in addition to the technical advantages achieved by the buffering regions 22. Therefore, by the fifth modification of the fifth embodiment, in addition to the technical advantages explained respectively in the basic configuration of the fifth embodiment to the fourth modification of the fifth embodiment, the fabrication-process can be simplified.

6. Sixth Embodiment

Figure 26:
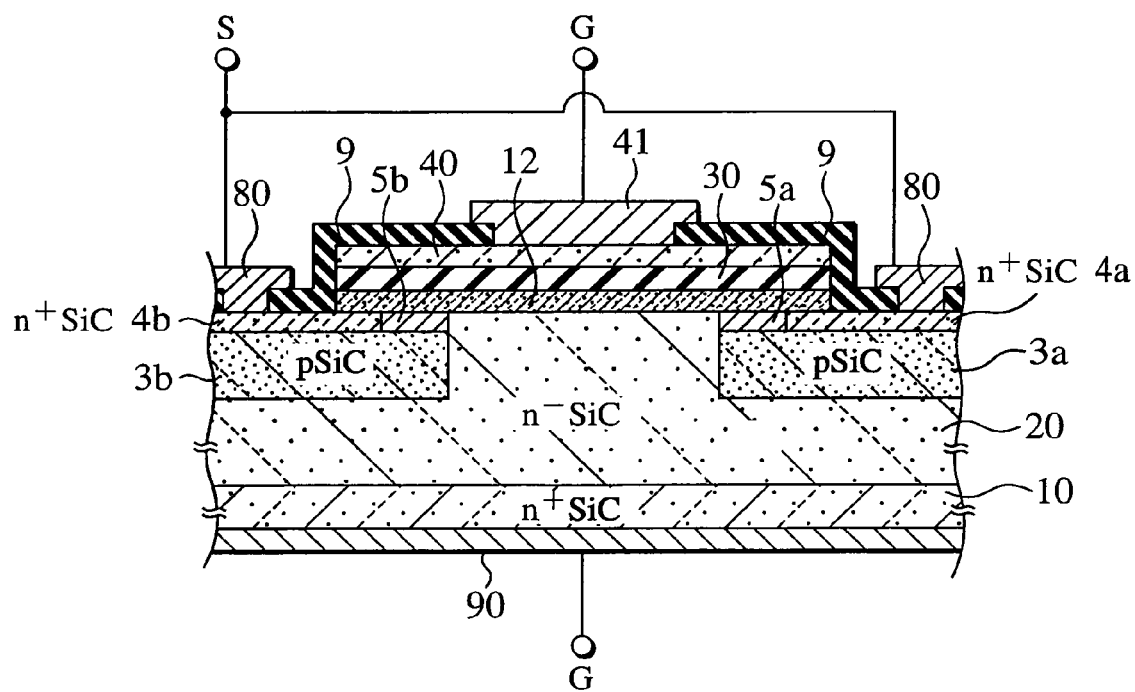
FIG. 26 is a cross sectional view showing a part of a tunnel-injection device of the sixth embodiment of the present invention.

6.1 Basic Configuration of Sixth Embodiment:

FIG. 26 is a cross-sectional view showing a configuration of a tunnel-injection device related to the sixth embodiment of the present invention. In FIG. 26, a tunnel-injection device encompassing an n⁻ type drift layer 20 formed on a heavily doped n⁺ type substrate 10 is shown as an example. And, in a predetermined region in the top surface of the n⁻ type drift layer 20, p type body regions 3a, 3b and n⁺ type heavily doped source regions 4a, 4b are formed. The top surface of the respective p type body regions 3a, 3b serves as the channel regions 5a, 5b, when the tunnel-injection device operates.

In addition, on the n⁻ type drift layer 20, a p⁻ type lightly doped polysilicon film 12 is formed as the semiconductor layer. This semiconductor layer is made of materials having the bandgap smaller than SiC so that the semiconductor layer can serve as the channel, being controlled by the voltage applied to the gate electrodes 40. For example, single crystal silicon can replace the poly silicon. The lightly doped polysilicon film 12 is stacked on the drift layer 20 such that the lightly doped polysilicon film 12 can face one part of the heavily doped source regions 4a, 4b and the channel region generated at the top surface of the body regions 3a, 3b. The lightly doped polysilicon film 12 is formed so as to electrically connect the heavily doped source regions 4a, 4b to the drift layer 20.

The film thickness of the lightly doped polysilicon film 12 is made thin. In other words, the film thickness is determined such that when the voltage is applied to the polysilicon gate electrode 40, the gate electric field can extend to the top surface of the body regions 3a, 3b so as to form the inversion type channel in the channel regions 5a, 5b, through the lightly doped polysilicon film 12. On the top surface of the lightly doped polysilicon film 12, the poly silicon gate electrode 40 is disposed through a gate insulation film 30. An inter-layer insulation film 70 covers the poly silicon gate electrode 40.

Source electrodes 80 are formed so as to contact with the n⁺ type heavily doped source regions 4a, 4b. A metallic gate electrode 41 is formed so as to contact with the poly silicon gate electrode 40. On the bottom surface of the n⁺ type substrate 10, a drain electrode 90 is formed. In addition, p type body regions 3a, 3b are connected to the source electrodes 80, in a rear potion of the page, not illustrated, so that the potential of the body regions 3a, 3b become the same as the potential of the source electrodes 80.

Then, the lightly doped polysilicon film 12 and the n⁻ type drift layer 20 implement a p-n heterojunction. The p-n heterojunction generates the energy barrier ΔEc at the junction interface as shown in the energy band diagram of FIG. 2A. And, p—p heterojunction is implemented at each of the interfaces between the lightly doped polysilicon film 12 and the channel regions 5a or 5b. Each p—p heterojunction generates the energy barrier ΔEv, ascribable to valence band edge discontinuity at the junction interface. The holes accumulate in the p—p heterojunction interface in the p⁻ type lightly doped polysilicon film 12, because the holes do not have the energy to surmount the energy barrier ΔEv.

6.2 Operation of Tunnel-Injection Device of Sixth Embodiment:

In the bias condition such that a voltage is applied between the drain electrode 90 and the source electrodes 80, and when a positive voltage is applied to the metallic gate electrode 41, an inversion type channel is generated in the channel regions 5a, 5b, because the electric field extends to the top surface of the body regions 3a, 3b through the p⁻ type lightly doped polysilicon film 12. By the generation of the inversion type channel, electrons move from the source electrodes 80 to drain electrode 90 so as to establish the conducting state.

On the other hand, by removing the voltage applied to the metallic gate electrode 41, the drain electrode 90 is isolated from the source electrodes 80 electrically so as to establish the current blocking state. By such operations, the tunnel-injection device serves as switching devices.

6.3 Manufacturing Method of Tunnel-Injection Device of Sixth Embodiment:

Next, a method for manufacturing the tunnel-injection device shown in FIG. 26 will be explained with referring the cross-sectional views shown in FIGS. 27A–27G.

Figure 27A:
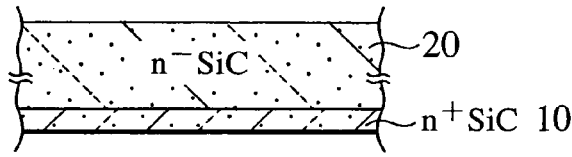
FIGS. 27A to 27G are process sectional views of the tunnel-injection device shown in FIG. 26.

(a) At first, as shown in FIG. 27A, an n⁺ type substrate 10 is prepared. The impurity concentration of the substrate 10 is, for example, $1 \times 10^{19}$ cm⁻³. The drift layer 20 having an impurity concentration lower than the substrate 10 is deposited on the top surface of this substrate 10, by CVD method. For example, the impurity concentration of the drift layer 20 may be $1 \times 10^{16}$ cm⁻³ and the thickness may be 10 μm.

(b) Next, on the top surface of the drift layer 20, a silicon oxide film is deposited by LPCVD method. By photolithography and etching, an oxidation film 31 is delineated so as to provide an implantation window in the desired portion of the silicon oxide film, covering other portion of the drift layer 20, thereby creating an implantation mask 31. Then, through the implantation mask 31, aluminum ions ($^{27}$Al⁺) are implanted so as to form p type body regions 3a, 3b as shown in FIG. 27B. For example, the implantation condition of aluminum is acceleration energy: 10–360 keV (multiple implantation), total dose rate: $2.5 \times 10^{13}$ cm⁻², substrate temperature: 800 degrees Celsius.

(c) Next, the implantation mask 31 made of silicon oxide film is removed by diluted hydrofluoric acid (HF) solution. Then, a new silicon oxide film is deposited by CVD method on the top surface of the drift layer 20 again. By photolithography and etching the new oxidation film is delineated so as to provide an implantation window in the desired portion of the new silicon oxide film, covering other portion of the drift layer 20, thereby creating another implantation mask 32. Then-phosphorus ions ($^{31}$P⁺) are implanted through the implantation window of the implantation mask 32 so as to form heavily doped source regions 4a, 4b as shown in FIG. 27C. For example, the implantation condition of phosphorus is acceleration energy: 20–150 keV (multiple implantation), total dose rate: $5 \times 10^{15}$ cm⁻², substrate temperature: 800 degrees Celsius.

(d) Next, the implantation mask 32 made of the silicon oxide film is removed by the diluted hydrofluoric acid solution. An annealing is performed for 30 minutes at 1500 degrees Celsius in the Ar ambient in order to activate the implanted aluminum ions and phosphorus ions.

Figure 27E:
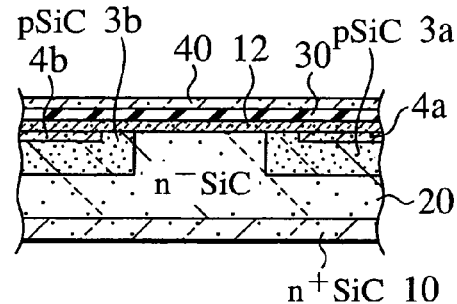
Figure 27B:
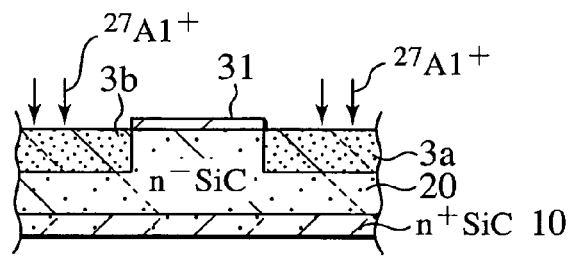
Figure 27F:
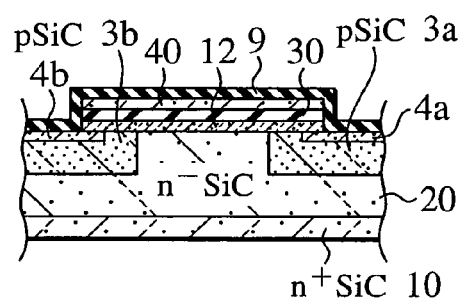
Figure 27C:
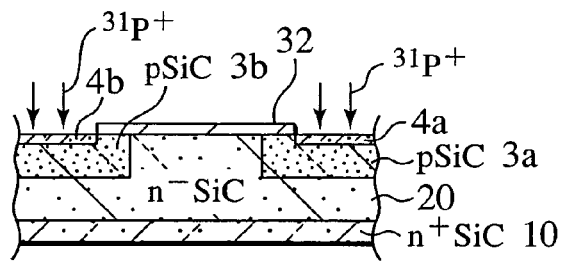
Figure 27G:
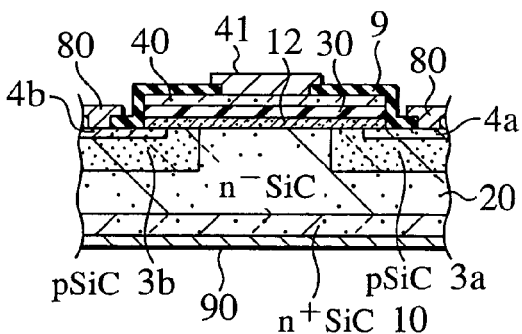
Figure 27D:
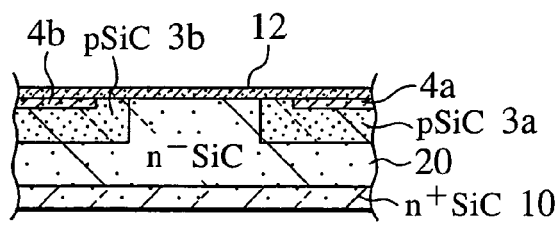

(e) Afterwards, by LPCVD method, a polysilicon film 12 is deposited as the semiconductor layer on the top surface of the drift layer 20 as shown in FIG. 27D. Here, the film thickness of the polysilicon film 12 is so determined such that when the voltage was applied to the polysilicon gate electrode 40, the gate electric field extends to the channel regions 5a, 5b of the top surface of the drift layer 20. Namely, the film thickness is determined as, for example, 20 nm. Afterwards, by using the ambient of BBr₃, boron atoms are diffused into the polysilicon film 12 so as to form the lightly doped polysilicon film. The diffusion condition of boron is 20 minutes at 700 degrees Celsius, for example.

(f) Next, as shown in FIG. 27E, as a gate insulation film 30, a silicon oxide film is deposited by CVD method. And, a new polysilicon film 40 is deposited on the silicon oxide film by LPCVD method. This new polysilicon film 40 is different from the former lightly doped polysilicon film 12, and serves as the polysilicon gate electrode 40. Here, the thickness of the gate insulation film 30 can be selected as around 50 nm, and the thickness of the new polysilicon film 40 is around 350 nm, for example. Afterwards, in the ambient of $POCl_3$, phosphorus atoms are diffused in the new polysilicon film 40. The diffusion condition of phosphorus is 20 minutes at 950 degrees Celsius, for example.

(g) Next, by photolithography and reactive ion etching (RIE), the lightly doped polysilicon film 12, the silicon oxide film 30 serving as the gate insulation film, and new polysilicon film 40 serving as the poly silicon gate electrode are selectively etched so as to define the gate insulation film 30 and the polysilicon gate electrode 40. Afterwards, as the inter-layer insulation film, a new silicon oxide film 9 is deposited by CVD method as shown in FIG. 27F.

(h) Then, a nickel film is deposited on the bottom surface of the substrate 10. In the ambient of Ar gas, at 1000 degrees Celsius, an annealing for one minute is executed so as to establish the drain electrode 90. Further, contact holes are opened in the inter-layer insulation film 9 by photolithography and etching. Through the contact holes, an aluminum film is deposited on the inter-layer insulation film 9. After the metallization-process using the photolithography and RIE, the metallic gate electrode 41 and the source electrodes 80 are defined as shown in FIG. 27G. Then, the configuration of the tunnel-injection device is completed.

In the sixth embodiment, the gate insulation film 30 is formed on the top surface of the lightly doped polysilicon film 12, and the gate insulation film 30 is not formed by thermal oxidization of the SiC directly. For this reason, the carbon cluster generated in earlier SiC MOSFET does not occur, and the interface state associated with the carbon cluster also does not occur.

Although the channel regions 5a, 5b is located right under the lightly doped polysilicon film 12, since the thickness of the lightly doped polysilicon film 12 is thin, when the voltage was applied to the metallic gate electrode 41, through the lightly doped polysilicon film 12, the gate electric field extends to the top surface of the body regions 3a, 3b, and the inversion type channel is formed in the channel regions 5a, 5b. As mentioned above, in this channel regions 5a, 5b, because there is no interface state ascribable to the carbon cluster, higher channel mobility can be realized.

On the top surface of the drift layer 20, sandwiched by the body regions 3a, 3b, the lightly doped polysilicon film 12, is disposed. Then, in the bias condition such that a high voltage is applied between the source electrodes 80 and the drain electrode 90, and the metallic gate electrode 41 is ground potential for establishing the current blocking state, the electrons accumulated in the lightly doped polysilicon film 12 in the p-n heterojunction interface between the lightly doped polysilicon film 12 and the drift layer 20, shield the electric field applied to the gate insulation film 30. Therefore, dielectric breakdown of the gate insulation film 30 can be prevented from occurring.

In addition, as a composition material of the semiconductor layer, single crystalline silicon or polysilicon is used, the process of the doping level control, such as thermal diffusion and the ion implantation, and the process of etching become easy.

6.5 First Modification of Sixth Embodiment:

In the basic configuration of the sixth embodiment, as shown in FIG. 26, the lightly doped polysilicon film 12 was disposed whole area just under the gate insulation film 30.

Figure 28:
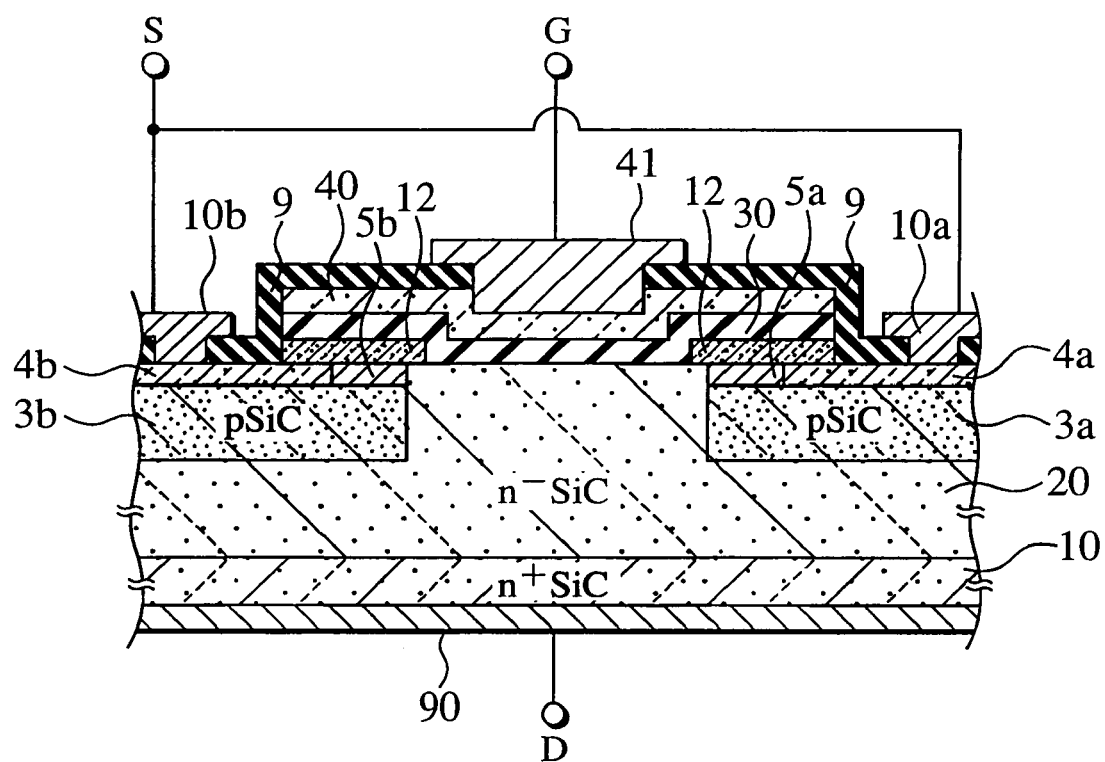
FIG. 28 is a cross sectional view of a tunnel-injection device of a first modification of the sixth embodiment of the present invention.

In a first modification of the sixth embodiment shown in FIG. 28, the lightly doped polysilicon films 12 can be disposed partially in desired portion, on the heavily doped source regions 4a, 4b, the channel regions 5a, 5b and a peripheral portion of the drift layer 20. Although the cross-sectional view shows as if two lightly doped polysilicon films 12 exist in FIG. 28, but the two lightly doped polysilicon films 12 can merged into single piece at the deep-portion of the paper (not illustrated) so as to form a ring shape, in an actual plan view. However, two spatially isolated lightly doped polysilicon films 12 can also exist in any manner.

Even in the configurations shown in FIG. 28, similar technical advantage achieved by the basic configuration of the sixth embodiment can be achieved.

6.6 Second Modification of Sixth Embodiment:

In the basic configuration of the sixth embodiment, as shown in FIG. 26, the lightly doped polysilicon film 12 was disposed over the whole area just under the gate insulation film 30.

Figure 29:
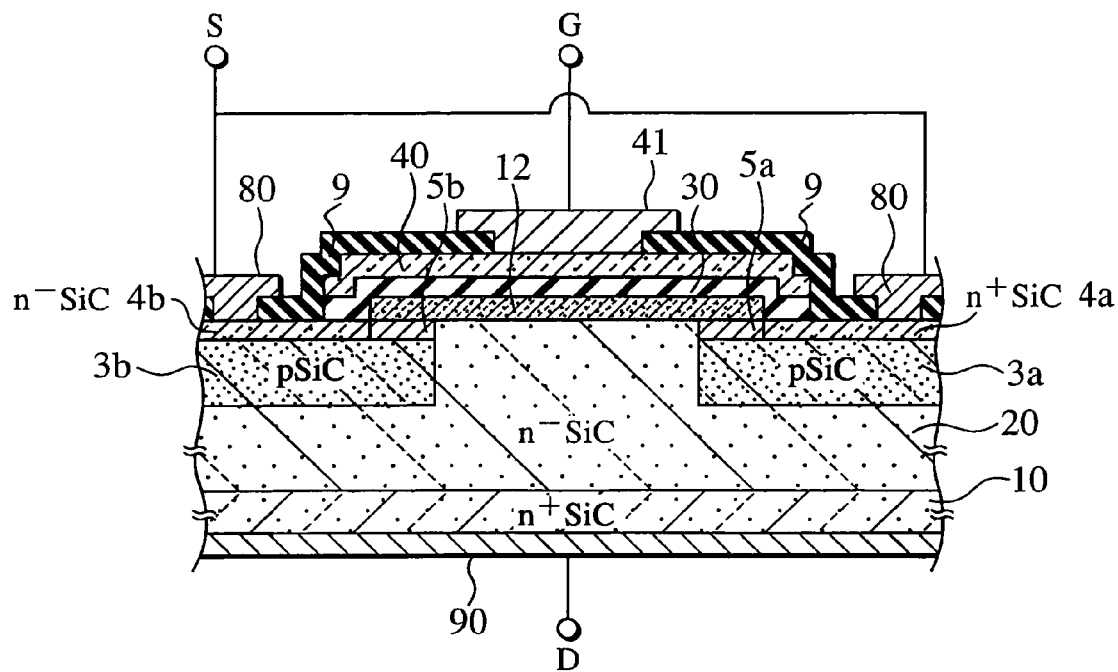
FIG. 29 is a cross sectional view of a tunnel-injection device of a second modification of the sixth embodiment of the present invention.

In a second modification of the sixth embodiment shown in FIG. 29, a small lightly doped polysilicon film 12 is disposed selectively on a limited area defined by the channel regions 5a, 5b and the drift layer 20.

Even in the configurations shown in FIG. 29, similar to the technical advantages achieved by the basic configuration of the sixth embodiment and the first modification of the sixth embodiment can be achieved.

Figure 30:
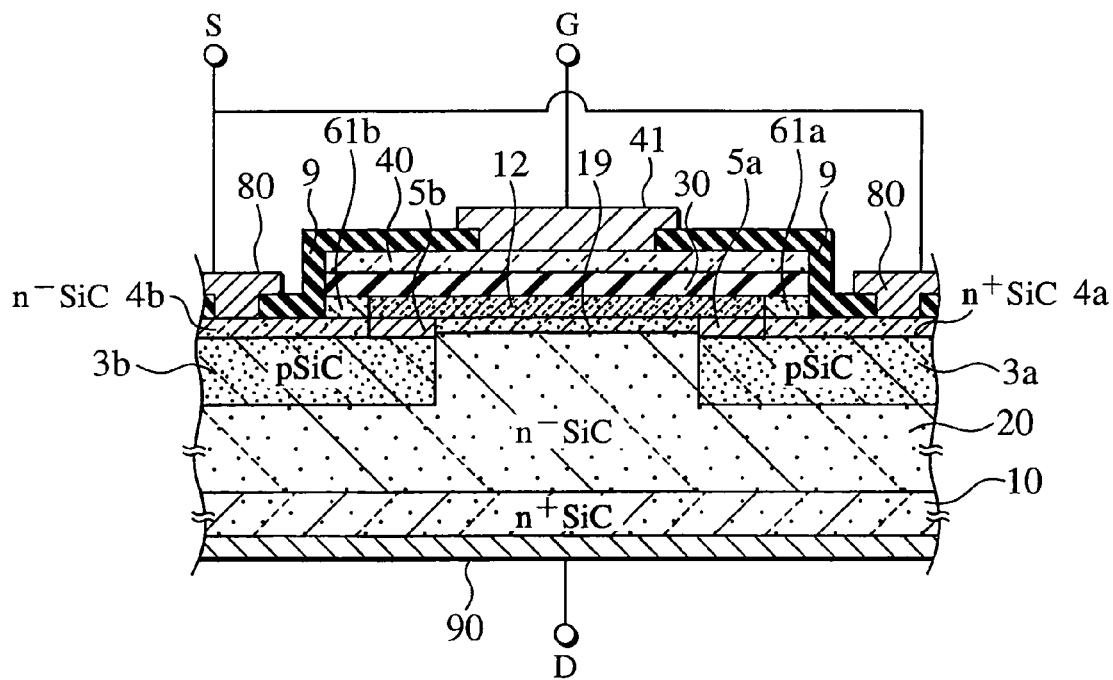
FIG. 30 is a cross sectional view showing a part of a tunnel-injection device of a seventh embodiment of the present invention.

7. Seventh Embodiment 7.1 Basic Configuration of Seventh Embodiment:

FIG. 30 is a cross-sectional view showing a configuration of a tunnel-injection device related to the seventh embodiment of the present invention. The tunnel-injection device according to the seventh embodiment encompasses an $n^-$ type drift layer 20 formed on a heavily doped $n^+$ type substrate 10. In a predetermined region in the top surface of the drift layer 20, p type body regions 3a, 3b and $n^+$ type heavily doped source regions 4a, 4b are formed. The top surface of each of the p type body regions 3a, 3b serve as channel regions 5a, 5b, when the tunnel-injection device operates. In the top surface of the $n^-$ type drift layer 20 sandwiched by the p type body regions 3a, 3b, an $n^+$ type heavily doped SiC layer 19 having an impurity concentration higher than the drift layer 20 is disposed. On the $n^+$ type heavily doped SiC layer 19 and the p type body regions 3a, 3b, an $n^-$ type lightly doped polysilicon film 12 is formed. On the $n^+$ type heavily doped source regions 4a, 4b, $n^+$ type heavily doped polysilicon films 61a, 61b having impurity concentrations higher than the $n^-$ type lightly doped polysilicon film 12 are respectively disposed. The $n^-$ type lightly doped polysilicon film 12 and the $n^+$ type heavily doped polysilicon films 61a, 61b are materials having bandgap smaller than SiC so that the top surface of the $n^-$ type drift layer 20, or the $n^+$ type heavily doped SiC layer 19 can serve as a channel, by controlling the voltage applied to the metallic gate electrode 41. For example, single crystalline silicon may be used for the polysilicon.

The lightly doped polysilicon film 12 is laminated on the top surface of the drift layer 20, parts of the heavily doped source regions 4a, 4b and the channel regions 5a, 5b formed in the top surface of the body regions 3a, 3b. The lightly doped polysilicon film 12 is laminated so that the lightly doped polysilicon film 12 can electrically connect the heavily doped source regions 4a, 4b to the drift layer 20. The film thickness of the lightly doped polysilicon film 12 is made thin. In other words, the film thickness of the lightly doped polysilicon film 12 is determined such that the gate electric field can extend to the top surfaces of the body regions 3a, 3b through the lightly doped polysilicon film 12 so as to form an inversion type channel in the channel regions 5a, 5b, when a voltage is applied to the metallic gate electrode 41. In the top surfaces of the lightly doped polysilicon film 12 and the heavily doped polysilicon film 61a, 61b, through a gate insulation film 30, a poly silicon gate electrode 40 is disposed. An inter-layer insulation film 9 covers the poly silicon gate electrode 40. The device further embraces source electrodes 80 being contacted with the $n^+$ type heavily doped source regions 4a, 4b and the metallic gate electrode 41 being contacted with the poly silicon gate electrode 40. In the bottom surface of the $n^+$ type substrate 10, a drain electrode 90 is formed. In addition, p type body regions 3a, 3b are connected to the source electrodes 80 so that the potential of the body regions 3a, 3b can have the same value of the source electrodes 80 in a backward portion of the paper, which is not illustrated.

7.2 Operation of Tunnel-Injection Device of Seventh Embodiment:

According to the tunnel-injection device of the seventh embodiment shown in FIG. 30, in addition to a switching operation of the tunnel-injection device explained in the basic configuration of the sixth embodiment, previously described, in the bias condition such that a voltage is applied between the drain electrode 90 and the source electrodes 80, and that a positive voltage is applied to the metallic gate electrode 41 so as to establish the conducting state, the gate electric field extends, through the gate insulation film 30, to the n—n heterojunction interface between the lightly doped polysilicon film 12 and the $n^+$ type heavily doped SiC layer 19. As an accumulation layer of electrons is formed in the interface between the $n^+$ type heavily doped SiC layer 19 and the lightly doped polysilicon film 12, and the slope of the triangular energy barrier $\Delta Ec$ of the n—n heterojunction interface becomes steep so that electrons can tunnel through the energy barrier $\Delta Ec$, through the lightly doped polysilicon film 12, the electrons flow from the source electrodes 80 to the drain electrode 90.

On the other hand, as the voltage applied to the metallic gate electrode 41 is removed so as to turn into the current blocking state, the accumulation layer of electrons disappears from the $n^+$ type heavily doped SiC layer 19 being contacted with the lightly doped polysilicon film 12, and the steep slope of energy barrier $\Delta Ec$ becomes gentle, thus broadening the barrier width. Therefore, there is very small probability that the electrons flowing in the conducting state will tunnel the barrier, and the movement of the electrons is blocked by the barrier so as to establish the current blocking state. By such operation, the tunnel-injection device serves as a switching device.

The tunneling process is explained in detail next. At first, the electrons supplied from the source electrodes 80 move into the heavily doped source regions 4a, 4b, and arrive at the interface between the $n^+$ type heavily doped polysilicon films 61a, 61b and the heavily doped source regions 4a, 4b. The contact between the $n^+$ type heavily doped polysilicon films 61a, 61b and the heavily doped source regions 4a, 4b establish an ohmic contact, because the slope of the energy barrier $\Delta Ec$ of the n—n heterojunction interface between the $n^+$ type heavily doped polysilicon films 61a, 61b and the heavily doped source regions 4a, 4b is steep. Then, the electrons move from the heavily doped source regions 4a, 4b through the $n^+$ type heavily doped polysilicon films 61a, 61b to the $n^-$ type lightly doped polysilicon film 12. The electrons flowing through the lightly doped polysilicon film 12 arrive at the interface of the lightly doped polysilicon film 12 and $n^+$ type heavily doped SiC layer 19. Because the interface of the lightly doped polysilicon film 12 and the $n^+$ type heavily doped SiC layer 19 implements the n—n heterojunction, energy band diagrams as shown in FIG. 15A to FIG. 15C can be manifested, depending on the bias conditions.

As shown in FIG. 15B, in the $n^+$ type heavily doped SiC layer 19 in the n—n heterojunction interface, the depletion layer broadens depending on the voltage applied to the drain electrode 90. Because the electrons existing in the lightly doped polysilicon film 12 cannot surmount the energy barrier $\Delta Ec$, the electrons accumulate in the junction interface. Because the electric field lines terminate in the junction interface so as to establish the depletion layer extending in the heavily doped SiC layer, the drain electric field is shielded in the lightly doped polysilicon film 12, and the current blocking state is maintained.

Next, when a voltage is applied to the metallic gate electrode 41 so as to turn the tunnel-injection device from the current blocking state into the conducting state, because the lightly doped polysilicon film 12 is thin, through the gate insulation film 30, the gate electric field extends to the n—n heterojunction interface between the lightly doped polysilicon film 12 and the $n^+$ type heavily doped SiC layer 19. Then, the accumulation layer of electrons is formed in the $n^+$ type heavily doped SiC layer 19 being contacted with the lightly doped polysilicon film 12. Namely, the energy band diagram in the junction interface between the lightly doped polysilicon film 12 and the $n^+$ type heavily doped SiC layer 19 changes from the energy band diagram shown by the broken line to the energy band diagram shown by the solid line in FIG. 15C.

The energy band diagram shown by the solid line in FIG. 15C is depressed on both sides of the n—n heterojunction interface compared with the energy band diagram when the metallic gate electrode 41 is the ground potential as shown in broken line in FIG. 15C. Therefore, the slope of the triangular energy barrier $\Delta Ec$ at the n—n heterojunction interface becomes steep by the accumulation effect of the electrons so as to narrow the barrier width, the electrons can tunnel through the energy barrier $\Delta Ec$. Then, the electrons blocked by the energy barrier $\Delta Ec$ can move to the $n^+$ type heavily doped SiC layer 19 to establish the conducting state.

Next, when the metallic gate electrode 41 is grounded so as to turn the tunnel-injection device from the conducting state to the current blocking state, the accumulation of the electrons in the n—n heterojunction interface of the lightly doped polysilicon film 12 and $n^+$ type heavily doped SiC layer 19 is removed, the tunneling through the energy barrier $\Delta Ec$ stops. Therefore, the flow of the electrons from the lightly doped polysilicon film 12 to the $n^+$ type heavily doped SiC layer 19 stops. Furthermore, as the electrons in the $n^+$ type heavily doped SiC layer 19 are swept away to the substrate 10, in the $n^+$ type heavily doped SiC layer 19 the depletion layer broadens from the n—n heterojunction interface so as to establish the current blocking state.

7.3 Manufacturing Method of Tunnel-Injection Device of Seventh Embodiment:

Next, a method for manufacturing the tunnel-injection device of the seventh embodiment shown in FIG. 30 will be explained referring to the cross-sectional views shown in FIGS. 31A–32I.

Figure 31A:
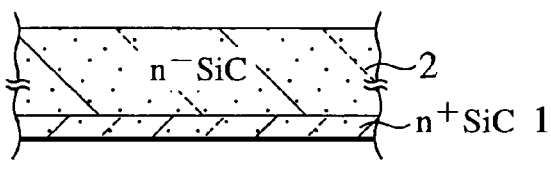
FIGS. 31A to 31I are process sectional views of the tunnel-injection device shown in FIG. 30.

(a) At first, as shown in FIG. 31A, an $n^+$ type substrate 10 is prepared. The impurity concentration of the substrate 10 is, for example, $1 \times 10^{19}$ cm$^{-3}$. On the top surface of this substrate 10, a drift layer 20 having an impurity concentration lower than the substrate 10 is deposited by CVD method. The impurity concentration of the drift layer 20 and thickness are respectively, for example, $1 \times 10^{16}$ cm$^{-3}$, 10 µm.

Figure 31B:
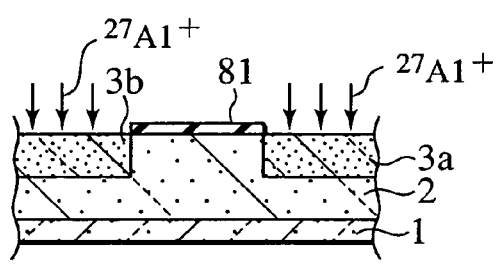

(b) Next, on the top surface of the drift layer 20, a silicon oxide film is deposited by LPCVD method, and by the photolithography and etching, an implantation mask 81 is formed in a desired portion by the silicon oxide film. Then, through the implantation mask 81, aluminum ions ($^{27}$Al$^+$) are implanted so as to form the p type body regions 3a, 3b as shown in FIG. 31B. The implantation conditions for the aluminum ions are, for example, the acceleration energy: 10–360 keV (multiple implantation), the total dose rate: $2.5 \times 10^{13}$ cm$^{-2}$, the substrate temperature: 800 degrees Celsius.

Figure 31C:
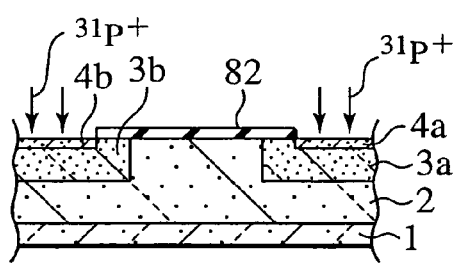

(c) Next, the implantation mask 81 made of the silicon oxide film mask is removed by diluted hydrofluoric acid solution. On the top surface of the drift layer 20, a new (a second) silicon oxide film is deposited by CVD method. By a photolithography and etching, a new (a second) implantation mask 82 is formed in a desired portion by the second silicon oxide film. Phosphorus ions are implanted through the second implantation mask 82 so as to form the heavily doped source regions 4a, 4b as shown in FIG. 31C. The implantation conditions for phosphorus ions are, for example, as follows: the acceleration energy: 20–150 keV (multiple implantation), the total dose rate: $5 \times 10^{15}$ cm$^{-2}$, substrate temperature: 800 degrees Celsius.

Figure 31D:
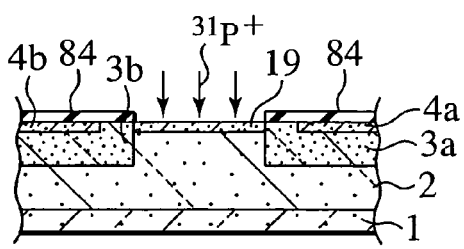

(d) Next, the second implantation mask 82 made of the second silicon oxide film mask is removed by diluted hydrofluoric acid solution. On the top surface of the drift layer 20, a further new (the third) silicon oxide film is deposited by CVD method. By photolithography and etching, a third implantation mask 82 made of the third silicon oxide film mask is formed in a desired portion. Then, through the third implantation mask 82, phosphorus ions ($^{31}$P$^+$) are implanted so as to form the heavily doped SiC layer 4a, 4b as shown in FIG. 31D. The implantation conditions for phosphorus ions are, for example, the acceleration energy: 5 keV, the total dose rate: $1 \times 10^{15}$ cm$^{-2}$, the substrate temperature: 800 degrees Celsius.

Figure 31E:
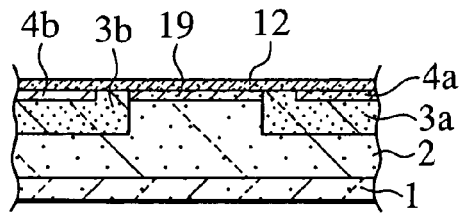

(e) Next, the third implantation mask 82 made of the third silicon oxide film mask is removed by diluted hydrofluoric acid solution. And in the Ar ambient, an annealing for 30 minutes is executed at temperature of 1500 degrees Celsius, in order to activate the implanted aluminum ions and phosphorus ions. Thereafter, by LPCVD method, on the top surface of the drift layer 20, a polysilicon film 12 is deposited as shown in FIG. 31E. The film thickness of the polysilicon film 12 is so determined such that the gate electric field can extends to the channel regions 5a, 5b disposed in the top surface of the drift layer 20, when a voltage is applied to the metallic gate electrode 41. Therefore, the film thickness of the polysilicon film 12 is, for example, around 20 nm.

(f) Afterwards, in the ambient of POCl$_3$, phosphorus atoms are thermally diffused into the polysilicon film so as to form the lightly doped polysilicon film 12. The diffusion condition of the phosphorus atom is 20 minutes at 700 degrees Celsius, for example.

Figure 31F:
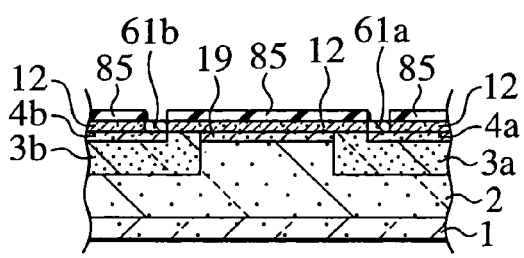

(g) Next, on the top surface of the lightly doped polysilicon film 12, a silicon-nitride film is deposited by CVD method. By photolithography and etching, a selective diffusion mask 85 is formed in a desired portion as shown in FIG. 31F. Afterwards, by a predisposition-drive-in method, through the selective diffusion mask 85, phosphorus atoms are doped into the lightly doped polysilicon film 12 so as to form the $n^+$ type heavily doped polysilicon films 61a, 61b. The thermal diffusion time of phosphorus atoms is 20 minutes at the temperature of 950 degrees Celsius, for example.

Figure 31G:
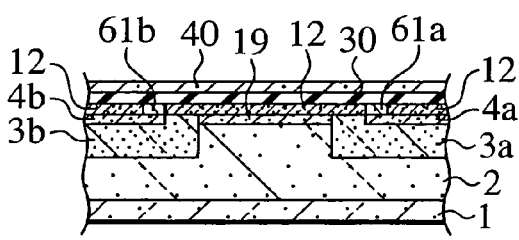

(h) Next, a silicon oxide film is deposited for the gate insulation film 30 by CVD method. And a new (a second) polysilicon film 40 is deposited on the gate insulation film 30 by LPCVD method as shown in FIG. 31G. The second polysilicon film 40 is different from the former (the first) lightly doped polysilicon film 12, and the second polysilicon film 40 serves as the poly silicon gate electrode 40. Here, the thickness of the gate insulation film 30 is around 50 nm, and the thickness of the second polysilicon film 40 is around 350 nm, for example.

(i) Afterwards, in the ambient of POCl3, phosphorus atoms are diffused into the second polysilicon film 40. For example, the thermal diffusion time for phosphorus atom is 20 minutes, at a temperature of 950 degrees Celsius 20.

Figure 31H:
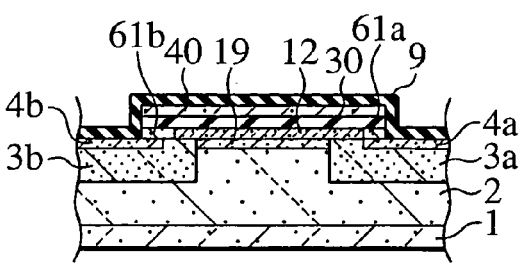

(j) Next, as shown in FIG. 31H, by photolithography and RIE, the first polysilicon film 12, the silicon oxide films serving as the gate insulation film 30, the second polysilicon film 40 serving as the poly silicon gate electrode are respectively etched so as to form the gate insulation film 30 and the poly silicon gate electrode 40.

Figure 31I:
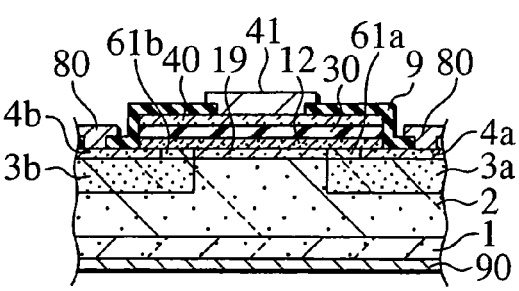

(k) Afterwards, as an inter-layer insulation film, a still new (a fourth) silicon oxide film 9 is deposited by CVD method. As shown in FIG. 31I, a nickel film is deposited on the bottom surface of the substrate 10. By the annealing for one minute at a temperature of 1000 degrees Celsius in ambient of Ar, the drain electrode 90 is formed. Afterwards, by photolithography and etching, contact holes are formed in the inter-layer insulation film 9. On the inter-layer insulation film 9, an aluminum film is deposited. And, photolithography and RIE delineate the aluminum film so as to form the metallic gate electrode 41 and the source electrodes 80. This fabrication-process completes the tunnel-injection device having the configuration shown in FIG. 30.

In the seventh embodiment, because the lightly doped polysilicon film 12 has the same conductivity type of the heavily doped source regions 4a, 4b, or the n type, in the bias condition such that a high voltage is applied between the source electrodes 80 and the drain electrode 90, as an appropriate voltage is applied to the metallic gate electrode 41, the electrons can move in the lightly doped polysilicon film 12. Because, the electrons can move through the path different from the inversion type channel in the conducting state, the on-state resistance can be lowered.

Because the impurity concentration of the heavily doped polysilicon film 61a, 61b contacting with the heavily doped source regions 4a, 4b is higher than the lightly doped polysilicon film 12 not contacting with the heavily doped source regions 4a, 4b, the slope of the triangular energy barrier ΔEc disposed at the n—n heterojunction interface between the lightly doped polysilicon film 12 and the heavily doped source regions 4a, 4b becomes steep. Therefore, under a bias condition such that a high voltage is applied between the source electrodes 80 and the drain electrode 90, and an appropriate voltage is applied to the metallic gate electrode 41 so as to establish the conducting state, the electrons being transported from the heavily doped source regions 4a, 4b to the lightly doped polysilicon film 12 are easily able to tunnel through the energy barrier $\Delta$Ec at the n—n heterojunction interface between the heavily doped source regions 4a, 4b and the lightly doped polysilicon film 12. Because electrons can easily move through the lightly doped polysilicon film 12 in the conducting state, the on-state resistance can be lowered further more.

Furthermore, in the top surface of the drift layer 20 sandwiched by body regions 3a, 3b, the n$^+$ type heavily doped SiC layer 19 is disposed, whose impurity concentration is higher than the drift layer 20, having the same conductivity type as the drift layer 20. Therefore, in the bias condition such that a high voltage is applied between the source electrodes 80 and the drain electrode 90, and an appropriate voltage is applied to the metallic gate electrode 41 so as to establish the conducting state, the electrons flowing from the heavily doped source regions 4a, 4b to the drift layer 20 through the lightly doped polysilicon film 12 can easily tunnel through the energy barrier $\Delta$Ec in the n—n heterojunction interface between the lightly doped polysilicon film 12 and the n$^+$ type heavily doped SiC layer 19. Therefore, in the conducting state, electrons are easily able to flow through the lightly doped polysilicon film 12, thus reducing the on-state resistance.

8. Other Embodiments

Various modifications will become possible for those skilled in the art after receiving the teaching of the present disclosure without departing from the scope thereof.

That is, in the above embodiments, although the plan view were not explicitly shown, but explained such that the gate electrodes 40 and source electrodes 80 have been shaped in stripe topology, running in-parallel, but the topology of the gate electrodes 40 and source electrodes 80 can be implemented as a ring-shape, for example.

Figure 32:
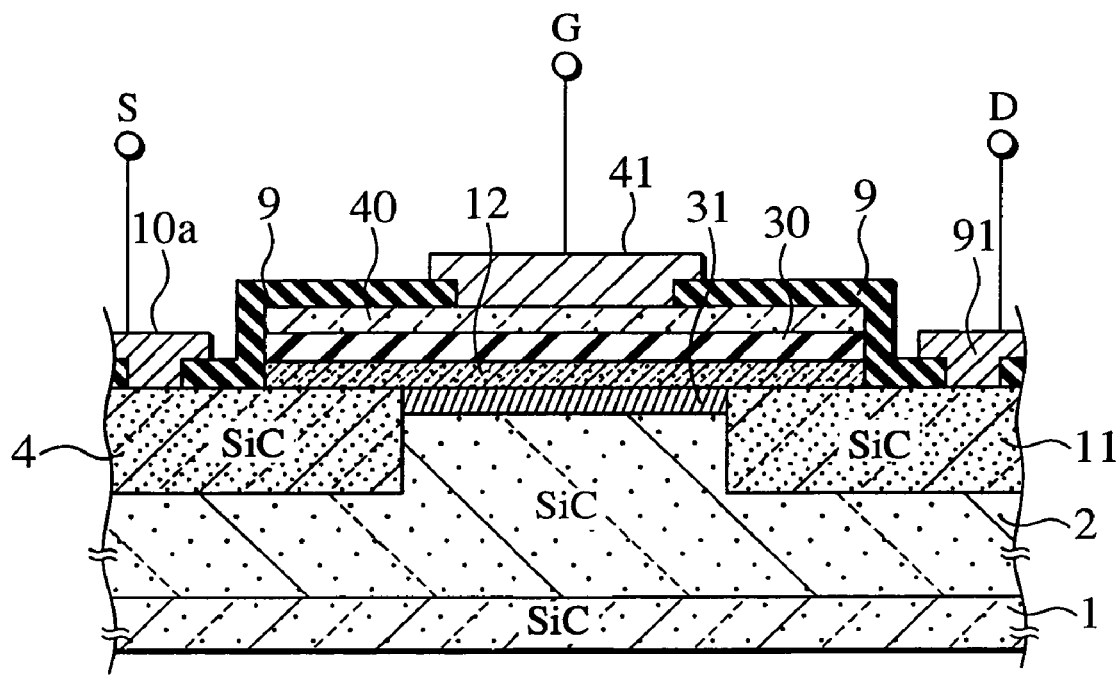
FIG. 32 is a cross sectional view of a tunnel-injection device of another embodiment of the present invention.

Furthermore, vertical tunnel-injection devices, each having the drain electrode 90 disposed on the back surface of the semiconductor substrate 10 and the source electrodes 80 disposed on the top surface of the semiconductor substrate 10 so that current can flow in the vertical direction in the inside of the element was mainly explained, but the drain electrode can be arranged on the top surface of the substrate 10 surface with the source electrodes so that current can flow in a lateral direction so as to implement the lateral tunnel-injection device as shown in FIG. 32.

As shown in FIG. 32, an n$^+$ type heavily doped SiC source region 4 and an n$^+$ type heavily doped SiC drain region 11 are disposed in the top surface of a p type SiC drift region 2 formed on the p type SiC substrate 1 so as to implement a lateral tunnel-injection device. In the top surface of the p type SiC drift region 2 between the n$^+$ type heavily doped source region 4 and the n$^+$ type heavily doped drain region 11, a channel region 31 is formed in the lateral tunnel-injection device, and technical advantages the same as the vertical tunnel-injection device explained in the first to seventh embodiments can be achieved, although the structure shown in FIG. 32 may corresponds to sixth embodiment.

The configuration in which the drain region 10 having n type conductivity type was described in the above first to seventh embodiments, but the drain region 10 can be p type.

Namely, in the above embodiment, the combination of the n type SiC and the p type polysilicon for establishing the p-n heterojunction and the combination of the n type SiC and the n type polysilicon for establishing the n—n heterojunction were mainly explained. However, the combination of the p type SiC and the p type polysilicon for establishing the p—p heterojunction, or the combination of the p type SiC and the n type polysilicon for establishing the n-p heterojunction can be employed as well. For example, by means of energy band diagram shown in FIG. 33A to FIG. 33C, the behavior of the p-p heterojunction between p$^-$ type SiC serving as the drift layer 2 and p$^-$ type polysilicon 12 will be explained in detail. In each energy band diagram of FIG. 33A to FIG. 33C, the energy band of the p$^-$ type silicon 12 is shown in the left side and the energy band diagram of the p$^-$ type SiC drift layer 2 is shown in the right side. In the junction interface between silicon and SiC, there is an energy barrier $\Delta$Ev ascribable to the band-edge discontinuity at valence band.

Figure 33A:
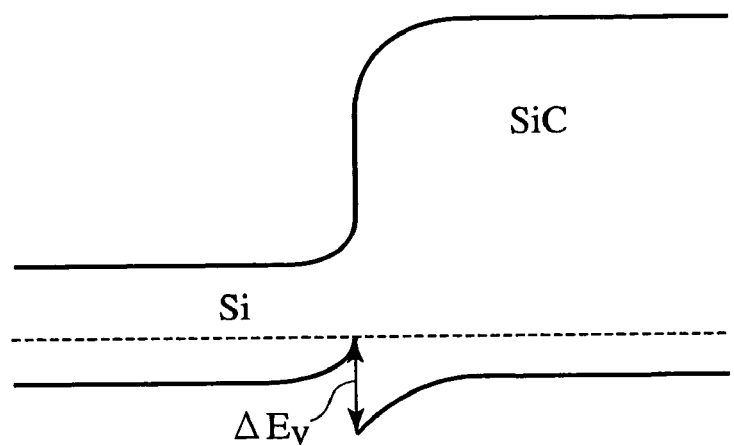
FIGS. 33A to 33C are energy band diagrams showing band-edge discontinuity barrier formed at an interface of p—p heterojunction for explaining the operation of a tunnel-injection device of another embodiment of the present invention.
Figure 33B:
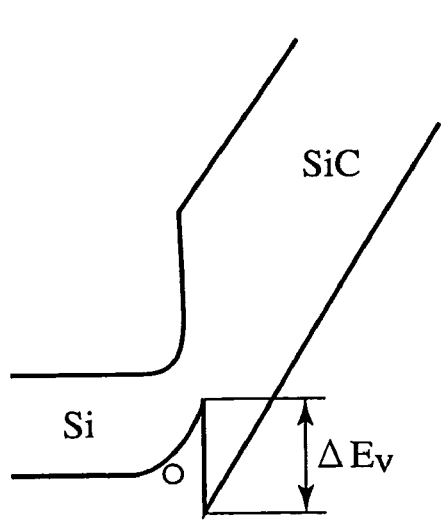
Figure 33C:
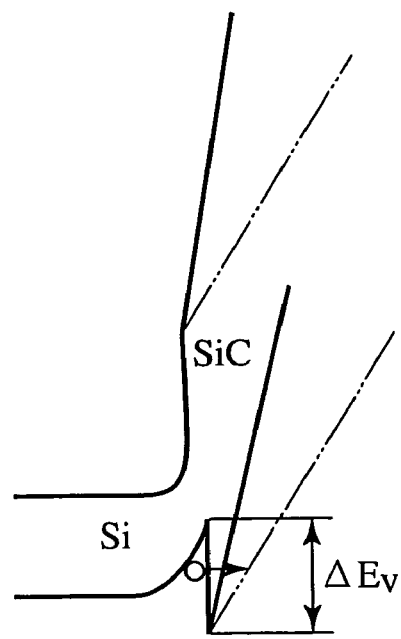

FIG. 33A is the energy band diagram in so-called thermal equilibrium state, in which none of the metallic gate electrode 41, the source electrodes 10a and the drain electrode 91 are biased. FIG. 33B corresponds to a bias condition in which the metallic gate electrode 41 and the source electrodes 10a are both grounded, but a predetermined negative potential is applied to the drain electrode 91. As shown in FIG. 33B, a depletion layer broadens in the SiC drift layer 2 of the p—p heterojunction interface, depending on the applied drain-potential. Because holes in the valence band in the polysilicon film 12 cannot surmount the energy barrier $\Delta$Ev, holes accumulate in the junction interface.

Next, so as to transit from the current blocking state to conducting state, as negative potential is applied to the metallic gate electrode 41, under the condition that the polysilicon film serving as the source region is made thin, the gate electric field extends through the gate insulation film 30 to the p—p heterojunction interface between the polysilicon film 12 and the SiC drift layer 2, and an accumulation layer of the holes is formed in the polysilicon film 12 and the SiC drift layer 2. In other words, the energy band diagram in the junction interface between the polysilicon film 12 just under the metallic gate electrode 41 and the SiC drift layer 2, varies as shown by the solid line in FIG. 33C. Because the energy band varies along the solid line, the slope of the triangular energy barrier $\Delta$Ev becomes steep, holes in the valence band can tunnel through the energy barrier $\Delta$Ev. Then, holes in the valence band, which were blocked by the energy barrier $\Delta$Ev, can be injected from the source electrodes 10a through the polysilicon film 12 to the SiC drift layer 2 so as to implement the conducting state.

When the metallic gate electrode 41 is ground again so that the conducting state can turn into the current blocking state, the accumulation-state of the holes formed in the p—p heterojunction interface between the polysilicon film 12 and the SiC drift layer 2 is removed, and the tunneling through the energy barrier $\Delta$Ev stops. In addition, the flow of holes in the valence band from the polysilicon film 12 to the SiC drift layer 2 stops. Furthermore, when holes in the SiC drift layer 2 are transported to the drain region 11 and swept out, the depletion layer broadens in the SiC drift layer 2 from the p—p heterojunction so as to establish the current blocking state.

Therefore, the case of the accumulation type channel can achieve the similar technical advantages, although in the first to seventh embodiments, the channel regions are supposed to be the inversion type.

And, the combination of SiC for the first semiconductor and polysilicon for the second semiconductor is explained in the first to seventh embodiments, but various combination of materials can be employed as long as the bandgap of the second semiconductor is narrower than the first semiconductor, as already explained in the first embodiment. Thus, the present invention of course includes various embodiments and modifications and the like, which are not detailed above. Therefore, the scope of the present invention will be defined in the following claims.

This application claims benefit of priority under 35 USC 119 based on Japanese Patent Application-no. P2002-301540 filed Oct. 16, 2002; Japanese Patent Application-no. P2002-298944 filed Oct. 11, 2002; Japanese Patent Application-no. P2002-305066 filed Oct. 18, 2002; and Japanese Patent Application-no. P2002-324308 filed Nov. 7, 2002, the entire contents of which are incorporated by reference herein.

What is claimed is:

1. A tunnel-injection device comprising:
a drain region made of a substrate of a first semiconductor;
a reception layer made of the first semiconductor disposed on and metallurgically contacted with a top surface of the drain region;
a barrier-forming layer made of a second semiconductor having a bandgap energy narrower than the first semiconductor, being in metallurgical contact with the reception layer so as to form a band-edge discontinuity barrier by a heterojunction interface between the first and second semiconductors;
a gate insulating film disposed on the barrier-forming layer contacting to the heterojunction interface;
a gate electrode disposed on the gate insulating film configured to change a tunneling probability of the carriers, which are configured to be injected into the reception layer by tunneling through the band-edge discontinuity barrier, by controlling a width of the band-edge discontinuity barrier;
a carrier-supplying region made of the second semiconductor, being contacted with the barrier-forming layer, configured to supply the carriers to the barrier-forming layer;
a source electrode being contacted with the carrier-supplying region; and
an insulating film disposed at a limited area of and on a top surface of the reception layer.

2. The tunnel-injection device of claim 1, wherein the carrier-supplying region is disposed only on the insulating film.

3. The tunnel-injection device of claim 2, wherein the carrier-supplying region is laterally contacted with the barrier-forming layer so as to form junction interface between the carrier-supplying region and the barrier-forming layer on the insulation film.

4. A tunnel-injection device, comprising:
a reception layer made of a first semiconductor;
an insulating film disposed at a limited area of and on a top surface of the reception layer;
a barrier-forming layer made of a second semiconductor having a bandgap energy narrower than the first semiconductor, being disposed at another limited area of and on the top surface of the reception layer, forming a band-edge discontinuity barrier by a heterojunction interface between the first and second semiconductors;
a gate insulating film disposed at still another limited area of and on the top surface of the reception layer, being contacted with the barrier-forming layer;
a gate electrode disposed on the gate insulating film configured to change a tunneling probability of the carriers, which are configured to be injected into the reception layer by tunneling through the band-edge discontinuity barrier, by controlling a width of the band-edge discontinuity barrier; and
a carrier-supplying region made of the second semiconductor, disposed only on the insulating film, being laterally contacted with the barrier-forming layer, configured to supply the carriers to the barrier-forming layer.

5. The tunnel-injection device of claim 4, wherein conductivity type of the carrier-supplying region is same as the barrier-forming layer.

6. The tunnel-injection device of claim 4, wherein impurity-doping level of the carrier-supplying region is higher than the barrier-forming layer.

7. The tunnel-injection device of claim 4, wherein the reception layer comprises;
a heavily doped region being metallurgical contacting with the barrier-forming layer; and
a drift layer having impurity-doping level lower than the heavily doped region, being in metallurgical contact with the heavily doped region, configured to transport the carrier to the drain region.

8. The tunnel-injection device of claim 4, wherein the carrier-supplying region being stacked on the barrier-forming layer.

9. The tunnel-injection device of claim 4, wherein gate insulating film contacts with the top surface of the reception layer in a window part of the barrier-forming layer being buried in the reception layer.

10. The tunnel-injection device of claim 9, wherein the carrier-supplying region is buried in the barrier-forming layer so that the gate insulating film can cover simultaneously the top surfaces of the reception layer, the barrier-forming layer and the carrier-supplying region.

11. The tunnel-injection device of claim 4, wherein gate insulating film is spatially isolated from the top surface of the reception layer by the barrier-forming layer being laminated on the top surface of the reception layer.

12. The tunnel-injection device of claim 11, wherein gate insulating film contacts with the top surface of the barrier-forming layer in a window part of the carrier-supplying region being laminated on the top surface of the barrier-forming layer.

13. The tunnel-injection device of claim 11, wherein gate insulating film cover both the top surface of the barrier-forming layer and the top surface of the carrier-supplying region in a substantially same planar level.

14. The tunnel-injection device of claim 4, wherein the carrier-supplying region comprises the first semiconductor.

15. The tunnel-injection device of claim 14, wherein the carrier-supplying region is buried in the reception layer.

16. The tunnel-injection device of claim 15, wherein the barrier-forming layer cover simultaneously the top surfaces of the reception layer and the carrier-supplying region.

17. The tunnel-injection device of claim 15, further comprising a body region made of the first semiconductor having an opposite conductivity type of the reception layer, wherein the carrier-supplying region is disposed on the body region.

18. The tunnel-injection device of claim 15, wherein the carrier-supplying region serves as a source region of the insulated gate transistor.

19. A method for fabricating a tunnel-injection device, comprising:
preparing a substrate made of a first semiconductor;

homo-epitaxially growing a first layer made of the first semiconductor on a surface of the substrate;

forming a pattern of an insulating film having a first window portion exposing partially a surface of the first layer;

growing a second layer made of a second semiconductor having a bandgap energy narrower than the first semiconductor on the insulating film and, through the first window portion, on the surface of the first layer so as to form a heterojunction interface between the first and second semiconductors;

doping selectively first impurity atoms in the second layer above the first window portion so as to form a barrier-forming layer made of the second semiconductor, the barrier-forming layer forms a band-edge discontinuity barrier for a tunneling injection of carriers at the heterojunction unction interface;

doping selectively second impurity atoms with heavier doping level than the barrier-forming layer in the second layer above the insulating film so as to form a carrier-supplying region made of the second semiconductor, configured to supply carriers to the barrier-forming layer;

removing selectively a part of the second layer doped with the first impurity atoms so as to form a second window portion exposing partially the surface of the first layer;

depositing a gate insulating film on the barrier-forming layer and, through the second window portion, on the surface of the first layer so as to contact with the heterojunction interface;

forming a gate electrode on the gate insulating film, the gate electrode is configured to change a tunneling probability of the carriers, which are configured to be injected into the reception layer by tunneling through the band-edge discontinuity barrier, by controlling a width of the band-edge discontinuity barrier; and forming a source electrode on the carrier-supplying region.

* * * * *